(12) United States Patent
Peng et al.

(10) Patent No.: US 11,798,989 B2
(45) Date of Patent: Oct. 24, 2023

(54) STRAINED NANOWIRE CMOS DEVICE AND METHOD OF FORMING

(71) Applicant: Taiwan Semiconductor Manufacturing Co., Ltd., Hsinchu (TW)

(72) Inventors: Cheng-Yi Peng, Taipei (TW); Hung-Li Chiang, Taipei (TW); Yu-Lin Yang, Baoshan Township (TW); Chih Chieh Yeh, Taipei (TW); Yee-Chia Yeo, Hsinchu (TW); Chi-Wen Liu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/805,719

(22) Filed: Jun. 7, 2022

(65) Prior Publication Data

US 2022/0302257 A1 Sep. 22, 2022

Related U.S. Application Data

(60) Division of application No. 17/656,258, filed on Mar. 24, 2022, now Pat. No. 11,652,141, which is a
(Continued)

(51) Int. Cl.
*H01L 29/06* (2006.01)
*H01L 21/82* (2006.01)
(Continued)

(52) U.S. Cl.
CPC ...... *H01L 29/0673* (2013.01); *H01L 21/3081* (2013.01); *H01L 21/30604* (2013.01); *H01L 21/823807* (2013.01); *H01L 21/823821* (2013.01); *H01L 21/845* (2013.01); *H01L 27/0924* (2013.01); *H01L 27/1211* (2013.01);
(Continued)

(58) Field of Classification Search
CPC .......... H01L 29/0673; H01L 21/30604; H01L 21/823807; H01L 21/84
USPC .... 257/401, 369, 192, 76, 407, E27.06, 288, 257/273, 347, E21.42; 438/283
See application file for complete search history.

(56) References Cited

U.S. PATENT DOCUMENTS 6,974,729 B2 12/2005 Collaert et al.
7,893,492 B2 2/2011 Bedell et al.
(Continued)

FOREIGN PATENT DOCUMENTS

CN 103238208 A 8/2013
CN 103311297 A 9/2013
(Continued)

*Primary Examiner* — Sheikh Maruf
(74) *Attorney, Agent, or Firm* — Slater Matsil, LLP

(57) ABSTRACT

Transistor structures and methods of forming transistor structures are provided. The transistor structures include alternating layers of a first epitaxial material and a second epitaxial material. In some embodiments, one of the first epitaxial material and the second epitaxial material may be removed for one of an n-type or p-type transistor. A bottommost layer of the first epitaxial material and the second epitaxial material maybe be removed, and sidewalls of one of the first epitaxial material and the second epitaxial material may be indented or recessed.

20 Claims, 40 Drawing Sheets

Related U.S. Application Data division of application No. 16/939,726, filed on Jul. 27, 2020, now Pat. No. 11,309,385, which is a continuation of application No. 16/722,291, filed on Dec. 20, 2019, now Pat. No. 10,727,298, which is a continuation of application No. 15/817,601, filed on Nov. 20, 2017, now Pat. No. 10,535,732, which is a division of application No. 14/935,195, filed on Nov. 6, 2015, now Pat. No. 9,853,101.

(60) Provisional application No. 62/238,490, filed on Oct. 7, 2015.

(51) Int. Cl.

| | | |
|---|---|---|
| *H01L 29/66* | (2006.01) | |
| *H01L 29/775* | (2006.01) | |
| *H01L 21/8238* | (2006.01) | |
| *H01L 21/308* | (2006.01) | |
| *H01L 29/786* | (2006.01) | |
| *H01L 21/306* | (2006.01) | |
| *H01L 21/84* | (2006.01) | |
| *H01L 27/092* | (2006.01) | |
| *H01L 27/12* | (2006.01) | |
| *H01L 29/423* | (2006.01) | |
| *H01L 21/3065* | (2006.01) | |

(52) U.S. Cl.
CPC .... *H01L 29/0649* (2013.01); *H01L 29/42392* (2013.01); *H01L 29/66439* (2013.01); *H01L 29/66772* (2013.01); *H01L 29/66795* (2013.01); *H01L 29/775* (2013.01); *H01L 29/78696* (2013.01); *H01L 21/3065* (2013.01)

(56) References Cited

U.S. PATENT DOCUMENTS

| | | | |
|---|---|---|---|
| 8,785,981 B1 * | 7/2014 | Chang | H01L 29/66439 438/303 |
| 9,093,550 B1 | 7/2015 | Zhao et al. | |
| 9,123,627 B1 | 9/2015 | Qi et al. | |
| 9,209,247 B2 | 12/2015 | Colinge et al. | |
| 9,224,833 B2 | 12/2015 | Chen et al. | |
| 9,251,888 B1 | 2/2016 | Liaw | |
| 9,583,399 B1 | 2/2017 | Chen et al. | |
| 9,660,028 B1 * | 5/2017 | Cheng | H01L 29/42392 |
| 9,978,772 B1 | 5/2018 | Carlson | |
| 2010/0187503 A1 | 7/2010 | Moriyama et al. | |
| 2012/0261643 A1 * | 10/2012 | Cohen | H01L 21/02381 977/734 |
| 2013/0270512 A1 | 10/2013 | Radosavljevic et al. | |
| 2013/0279145 A1 | 10/2013 | Then et al. | |
| 2013/0280903 A1 | 10/2013 | Liaw et al. | |
| 2014/0001520 A1 | 1/2014 | Glass et al. | |
| 2014/0151638 A1 | 6/2014 | Chang et al. | |
| 2014/0151639 A1 * | 6/2014 | Chang | H01L 29/0673 257/27 |
| 2014/0175531 A1 | 6/2014 | Huang et al. | |
| 2014/0191335 A1 | 7/2014 | Yin et al. | |
| 2014/0197377 A1 | 7/2014 | Kim et al. | |
| 2014/0264280 A1 | 9/2014 | Kim et al. | |
| 2015/0041899 A1 | 2/2015 | Yang et al. | |
| 2015/0048442 A1 | 2/2015 | Colinge et al. | |
| 2015/0069328 A1 * | 3/2015 | Leobandung | B82Y 10/00 438/151 |
| 2015/0129830 A1 * | 5/2015 | Sung | B41N 10/04 438/283 |
| 2015/0228480 A1 * | 8/2015 | Yin | H01L 29/42392 438/283 |
| 2015/0228789 A1 | 8/2015 | Basker et al. | |
| 2015/0235908 A1 | 8/2015 | Cheng et al. | |
| 2015/0236019 A1 | 8/2015 | Basker et al. | |
| 2015/0255458 A1 | 9/2015 | Ando et al. | |
| 2015/0287614 A1 * | 10/2015 | Cheng | H01L 21/823821 257/192 |
| 2015/0303192 A1 | 10/2015 | Zhu | |
| 2015/0303198 A1 * | 10/2015 | Ching | H01L 21/30604 257/192 |
| 2015/0303270 A1 | 10/2015 | Liaw | |
| 2015/0340290 A1 | 11/2015 | Zhu | |
| 2015/0349123 A1 | 12/2015 | Cheng et al. | |
| 2015/0364593 A1 | 12/2015 | Jangjian et al. | |
| 2015/0364603 A1 * | 12/2015 | Cheng | H01L 29/42392 257/192 |
| 2016/0005866 A1 | 1/2016 | Wu et al. | |
| 2016/0027875 A1 | 1/2016 | Kim et al. | |
| 2016/0043225 A1 | 2/2016 | Ching et al. | |
| 2016/0071846 A1 | 3/2016 | Wen et al. | |
| 2016/0093614 A1 | 3/2016 | Cheng et al. | |
| 2016/0118480 A1 * | 4/2016 | Xie | H01L 21/823431 438/157 |
| 2016/0148935 A1 | 5/2016 | Chen et al. | |
| 2016/0149027 A1 | 5/2016 | Yin et al. | |
| 2016/0181366 A1 | 6/2016 | Oh et al. | |
| 2016/0190243 A1 | 6/2016 | Lee et al. | |
| 2016/0204263 A1 | 7/2016 | Mukherjee et al. | |
| 2016/0211322 A1 | 7/2016 | Kim et al. | |
| 2017/0005188 A1 | 1/2017 | Cheng et al. | |
| 2017/0117366 A1 | 4/2017 | Thompson et al. | |
| 2017/0213911 A1 | 7/2017 | Balakrishnan et al. | |
| 2017/0229538 A1 | 8/2017 | Cheng et al. | |
| 2018/0026038 A1 * | 1/2018 | Ching | H01L 27/0924 438/283 |
| 2019/0019551 A1 * | 1/2019 | Lee | G11C 13/0069 |
| 2019/0198638 A1 | 6/2019 | Van Houdt et al. | |

FOREIGN PATENT DOCUMENTS

| | | |
|---|---|---|
| CN | 103779226 A | 5/2014 |
| CN | 103855090 A | 6/2014 |
| CN | 104011849 A | 8/2014 |
| CN | 104377197 A | 2/2015 |
| KR | 10110121630 A | 11/2011 |
| TW | 201511226 | 3/2015 |
| TW | 201519442 | 5/2015 |

* cited by examiner

STRAINED NANOWIRE CMOS DEVICE AND METHOD OF FORMING

PRIORITY CLAIM AND CROSS-REFERENCE

This application is a continuation of U.S. patent application Ser. No. 17/656,258, filed Mar. 24, 2022, and entitled "Strained Nanowire CMOS Device and Method of Forming," which is a divisional of U.S. patent application Ser. No. 16/939,726, filed Jul. 27, 2020, now U.S. Pat. No. 11,309,385 issued Apr. 19, 2022, and entitled "Strained Nanowire CMOS Device and Method of Forming," which is a continuation of U.S. patent application Ser. No. 16/722,291, filed Dec. 20, 2019, now U.S. Pat. No. 10,727,298 issued Jul. 28, 2020, and entitled "Strained Nanowire CMOS Device and Method of Forming," which is a continuation of U.S. patent application Ser. No. 15/817,601, filed Nov. 20, 2017, now U.S. Pat. No. 10,535,732 issued Jan. 14, 2020, and entitled "Strained Nanowire CMOS Device and Method of Forming," which is a divisional of U.S. patent application Ser. No. 14/935,195, filed Nov. 6, 2015, now U.S. Pat. No. 9,853,101 issued Dec. 26, 2017, and entitled "Strained Nanowire CMOS Device and Method of Forming," which claims the benefit of the earlier filed provisional application U.S. Patent Application No. 62/238,490, filed Oct. 7, 2015, and entitled "Strained Nanowire CMOS Design and Flow," each application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
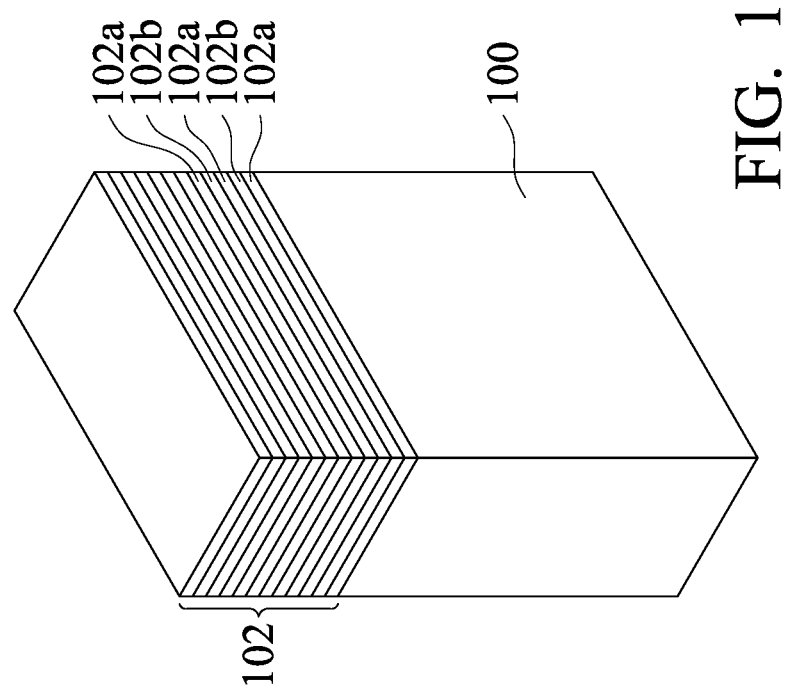
FIGS. 1-26 illustrate various cross-sectional and perspective views of intermediate stages in the formation of FinFETs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) with Gate-All-Around (GAA) structures and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements. It is appreciated that although FIGS. 1-26 illustrate formation of a p-type FinFET and an n-type FinFET for illustrative purposes, wherein the p-type FinFET exhibits a fin-like structure and a multi-gate gate electrode and the n-type FinFET exhibits nanowire-like structures with a GAA electrode. These examples are provided for illustrative purposes only and one of ordinary skill in the art would realize that the n-type FinFET may utilize a fin-like structure and the p-type FinFET may utilize nanowire-like structures when using different materials. It should also be appreciated that the various embodiments illustrated in FIGS. 27A-32D illustrate single structures for illustrative purposes and that the various n-type and p-type structures disclosed herein may be combined to form devices designed with various types of materials and operating characteristics.

FIGS. 1-26 illustrate various cross-sectional and perspective views for forming a p-type FinFET and an n-type FinFET on a substrate using the similar materials in accordance with some embodiments. Referring first to FIG. 1, a cross-sectional view of a substrate 100, which may be a part of a wafer, and an alternating epitaxial layer structure 102 is provided. In some embodiments, the substrate 100 comprises a crystalline silicon substrate (e.g., wafer). The substrate 100 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 100 may include an epitaxial layer (epi-layer), may be strained for performance enhancement, and/or may include a silicon-on-insulator (SOI) structure.

The alternating epitaxial layer structure 102 is formed over the substrate 100. As explained in greater detail below, the substrate 100 and the alternating epitaxial layer structure 102 will be patterned to form fins extending from the substrate 100. The fins will in turn be used to form p-type FinFETs and/or n-type FinFETs. Alternating ones of the alternating eptitaxial layers may be removed from channel regions of one conductivity type of fins, such as the n-type fins, thereby forming a nanowire structure extending between the source and drain regions. The alternating layers may be utilized for exerting stress in the channel region for another conductivity type of fins, such as a p-type fin. The embodiments described in this embodiment illustrate processes and materials that may be used to form nanowire structures with a GAA design for n-type FinFETs and stressed alternating layers for p-type FinFETs. However, other types of materials may be selected such that nanowires with GAA may be used to form p-type FinFETs and stressed alternating layers may be utilized for n-type FinFETs.

For example, in some embodiments the alternating epitaxial layer structure 102 may include alternating layers of a first epitaxial layer 102a and a second epitaxial layer 102b (collectively referred to as the alternating epitaxial layer structure 102), wherein the alternating epitaxial layer structure 102 may include any number of alternating layers from one layer of each of the first epitaxial layer 102a and a second epitaxial layer 102b to many layers (e.g., 2, 4, 6, or more) of each of the first epitaxial layer 102a and the second epitaxial layer 102b. In an embodiment in which nanowires are to be formed for n-type transistors, the first epitaxial layer 102a may be a silicon germanium layer and the second epitaxial layer 102b may be a silicon layer, wherein the silicon layer will form nanowires for the n-type FinFETs and the silicon germanium layers will act as the channel regions while the silicon layers act as stressors for the p-type FinFETs.

In some embodiments the silicon germanium layers are grown by a low pressure chemical vapor deposition (LPCVD) process performed at a temperature of about 400° C. to about 800° C. and under a pressure of about 1 to about 200 Torr, using $SiH_2Cl_2$ or $SiH_4$, $GeH_4$, and HCl, $B_2H_6$, or $H_2$ as reaction gases. The silicon layers are grown by an LPCVD process performed at a temperature of about 400° C. to about 750° C. and under a pressure of about 10 to about 200 Torr, using $SiH_2Cl_2$ or $SiH_4$ as reaction gases. In some embodiments the first epitaxial layer 102a and the second epitaxial layer 102b are each formed to a thickness from about 5 nm to about 10 nm. Thickness such as these allow the silicon layers to exert a compressive stress to the silicon germanium layers without allowing a surface of the silicon germanium layers to become relaxed, thereby improving the electrical performance of the p-type FinFETs. As mentioned above, these processes may be repeated any number of times to obtain the desired number of layers, which corresponds to the number of nanowires and channel regions.

Figure 2:
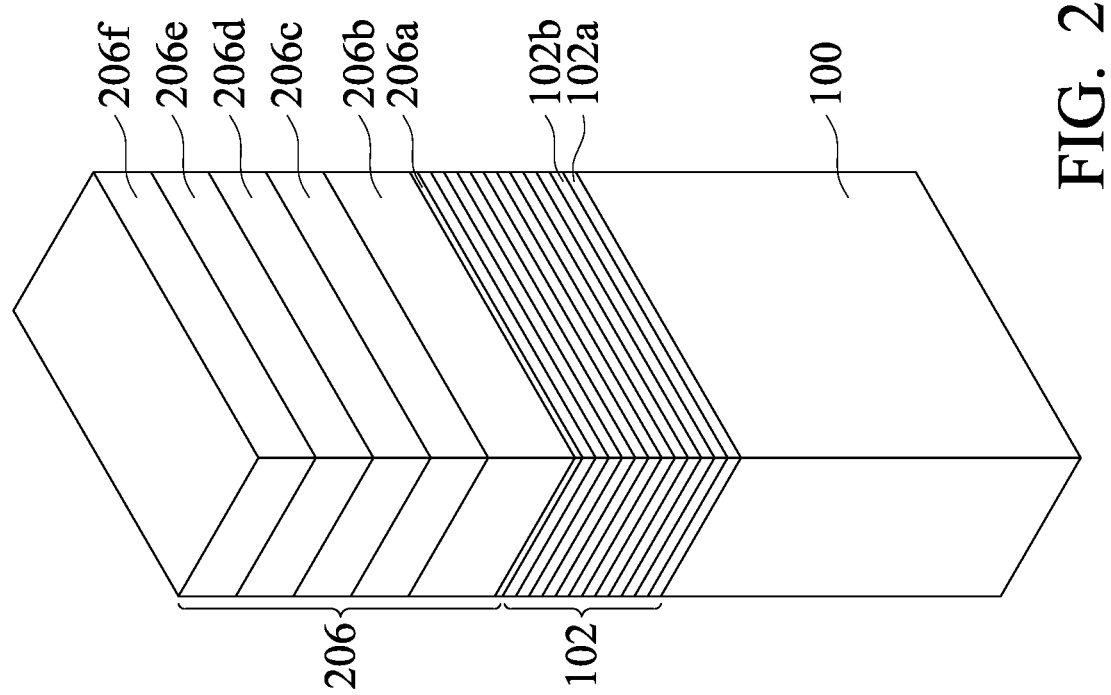

FIG. 2 illustrates the device after forming a masking layer 206 over the alternating epitaxial layer structure 102 in accordance with some embodiments. As an example, the masking layer 206 may comprise a first dielectric layer 206a, a second dielectric layer 206b, a third dielectric layer 206c, a polysilicon layer 206d, an advanced patterning film (APF) 206e, and a bottom anti-reflective coating (BARC) 206f, although different materials, layers, number of layers, or the like may be used. Generally, the first dielectric layer 206a, the second dielectric layer 206b, and third dielectric layer 206c act as a hardmask while the polysilicon layer 206d, the APF 206e and the BARC 206f in combination will be used to pattern the hardmask and for critical dimension control in order to obtain and control the desired dimensions of the patterning of the hardmask, e.g., the first dielectric layer 206a, the second dielectric layer 206b, and third dielectric layer 206c. The thickness of each layer may be adjusted such that each of the layers has sufficient thickness during the respective etching processes (discussed below) to protect the underlying material. The following materials are provided as an example and are not meant to limit the disclosure.

The first dielectric layer 206a may be deposited over the alternating epitaxial layer structure 102. The first dielectric layer 206a may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first dielectric layer 206a may be deposited through a process such as chemical vapor deposition (CVD), or a spin-on-glass process, although any acceptable process may be utilized to form the first dielectric layer 206a to a thickness between about 20 Å to about 80 Å. In some embodiments, the first dielectric layer 206a may be used as an etch stop layer (ESL) for subsequent processes.

The second dielectric layer 206b may be deposited over the first dielectric layer 206a. The second dielectric layer 206b may be formed of similar materials and similar processes as the first dielectric layer 206a, although the first dielectric layer 206a and the second dielectric layer 206b need not be the same material. In some embodiments, the second dielectric layer 206b may be formed to a thickness between about 300 Å to about 500 Å.

The third dielectric layer 206c may be deposited over the second dielectric layer 206b. The third dielectric layer 206c may be used as an ESL for subsequent processes and may be formed of similar materials and similar processes as the first dielectric layer 206a and the second dielectric layer 206b, although the first dielectric layer 206a, the second dielectric layer 206b, and the third dielectric layer 206c need not be the same materials. In an embodiment, the third dielectric layer 206c may be formed to a thickness between about 300 Å to about 700 Å. In some embodiments, the first dielectric layer 206a, the second dielectric layer 206b, and the third dielectric layer 206c may be a single dielectric layer rather than three separate layers.

In some embodiments the first dielectric layer 206a, the second dielectric layer 206b, and the third dielectric layer 206c comprise an oxide-nitride-oxide (ONO) layer, wherein the first dielectric layer 206a is an oxide (e.g., silicon oxide), the second dielectric layer 206b is a nitride (e.g., silicon nitride), and the third dielectric layer 206c is an oxide (e.g., silicon oxide).

The polysilicon layer 206d may be formed by depositing poly-silicon by LPCVD to a thickness in the range of about 50 Å to about 500 Å. The APF 206e may comprise amorphous carbon formed by a CVD process, although other suitable materials and methods of formation may alternatively be utilized. In some embodiments, the APF 206e is formed to a thickness of between about 50 Å and about 250 Å. Other thicknesses and materials may be used.

The BARC 206f may be formed over the APF 206e to aid in a subsequent photolithographic process to pattern an overlying layer (not shown), such as the patterned photoresist layer. The BARC 206f may comprise SiON, a polymer, the like, or a combination thereof and may be formed by CVD, a spin-on process, the like, or a combination thereof. The BARC 206f has a thickness sufficient to provide sufficient antireflective qualities based upon the materials and the wavelength. In an embodiment, the BARC layer 206f is formed to a thickness of between about 100 Å and about 2000 Å.

Figure 3:
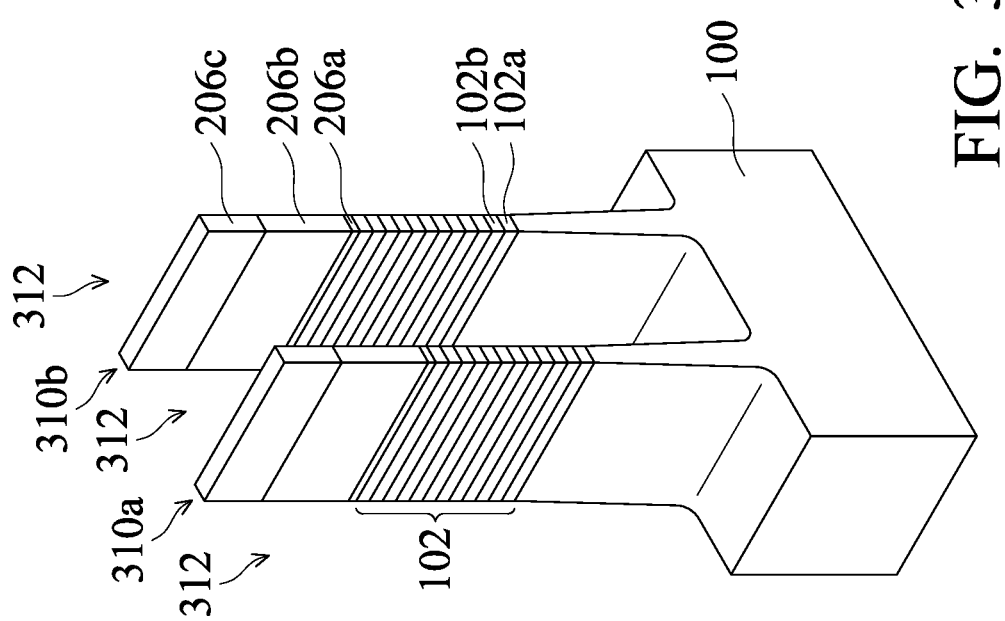

FIG. 3 illustrates the device after a patterning process is performed to form trenches 312 in accordance with some embodiments. In some embodiments, photolithography techniques are utilized to pattern the masking layer 206. Generally, a photoresist material (not shown) is deposited over the masking layer 206. The photoresist material is irradiated (exposed) to energy, e.g. light, through a patterned reticle in order to induce a reaction in those portions of the photoresist material exposed to the energy. The photoresist material is developed to remove a portion of the photoresist material, wherein the remaining photoresist material protects the underlying material from subsequent processing steps, such as etching.

As shown in FIG. 3, the patterning process forms trenches 312 through the alternating epitaxial layer structure 102 and into the substrate 100. The remaining regions of the alternating epitaxial layer structure 102 and the underlying substrate 100 form fins, such as a first fin 310a and a second fin 310b (collectively referred to as fins 310). As discussed in greater detail below, the first fin 310a will act as a fin of a p-type FinFET and the second fin 310b will be used to form nanowires for an n-type FinFET.

Figure 4:
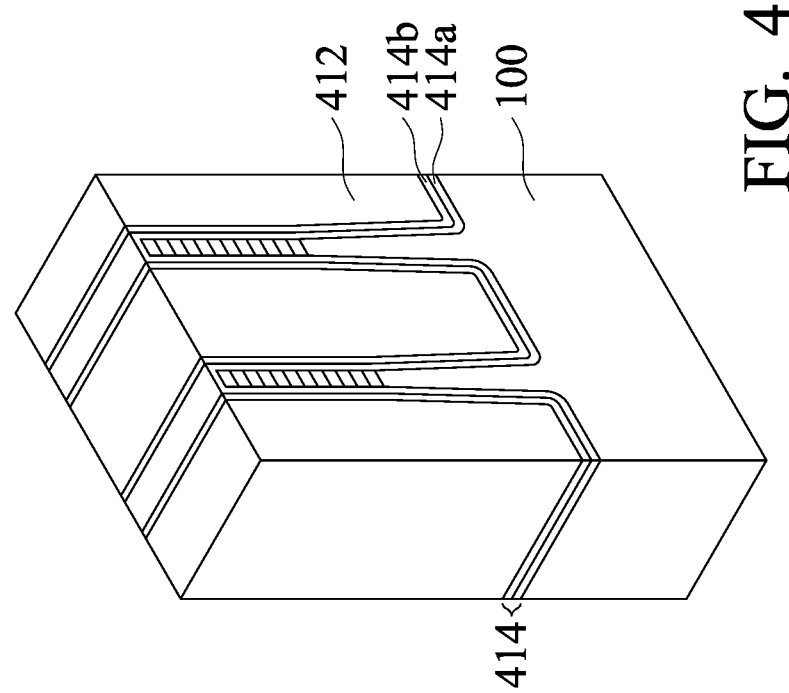

Referring now to FIG. 4, shallow trench isolations (STIs) 412 are formed in the trenches 312 between adjacent fins 310 in accordance with some embodiments. Prior to forming the STIs 412, one or more liners (collectively referred to as a liner 414) are formed over the substrate 100 and sidewalls of the fins 310. In some embodiments, the liner 414 has a single layer structure with a thickness between about 10 Å and about 50 Å. In other embodiments, the liner 414 has a bilayer structure comprising a first liner sub-layer 414a and a second liner sub-layer 414b as illustrated in FIG. 4. In some embodiments, the first liner sub-layer 414a comprises silicon oxide and has a thickness between about 5 Å and about 20 Å, and the second liner sub-layer 414b comprises silicon nitride and has a thickness between about 5 Å and about 30 Å. The liner 414 may be deposited through one or more processes such as physical vapor deposition (PVD), CVD, or atomic layer deposition (ALD), although any acceptable process may be utilized. Other materials and/or processes may be used.

The STIs 412 may be made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. In some embodiments, the STIs 412 are formed through a process such as CVD, flowable CVD (FCVD), or a spin-on-glass process, although any acceptable process may be utilized. Subsequently, portions of the STIs 412 extending over the top surfaces of the fins 310, and portions of the liner 414 over the top surfaces of the fins 310 are removed using, for example, an etch process, chemical mechanical polishing (CMP), or the like.

Figure 5:
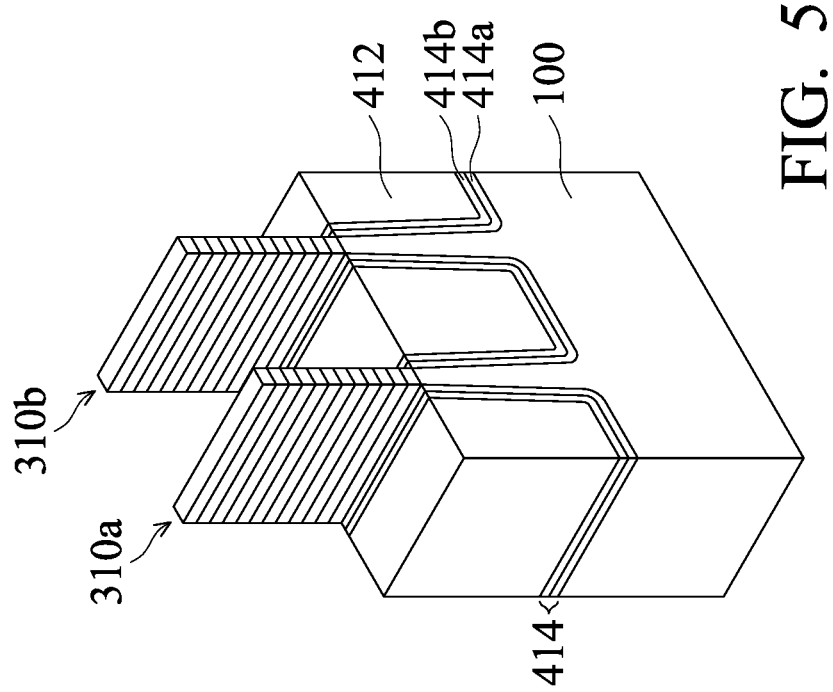

FIG. 5 illustrates recessing of the STIs 412 and the liner 414 to expose sidewalls of the fins 310 in accordance with some embodiments. In some embodiments, the STIs 412 and the liner 414 are recessed using one or more selective etch processes utilizing the fins 310 as an etch mask. For example, the STIs 412 and the liner 414 are recessed using a single etch processes. In alternative embodiments, the STIs 412 and the liner 414 are recessed using a multiple etch processes. For example, the STIs 412 are recessed using a first etch process utilizing the fins 310 and the liner 414 as an etch mask, and subsequently, the liner 414 is recessed using a second etch process.

A depth of the recess is determined by a height of the alternating epitaxial layer structure 102. As explained in greater detail below, the first epitaxial layers 102a will be removed. Accordingly, the depth of the recess is such that the bottommost first epitaxial layer 102a is exposed, thereby allowing the bottommost, as well as the others, first epitaxial layer 102a to be removed using an etch process.

Figure 6:
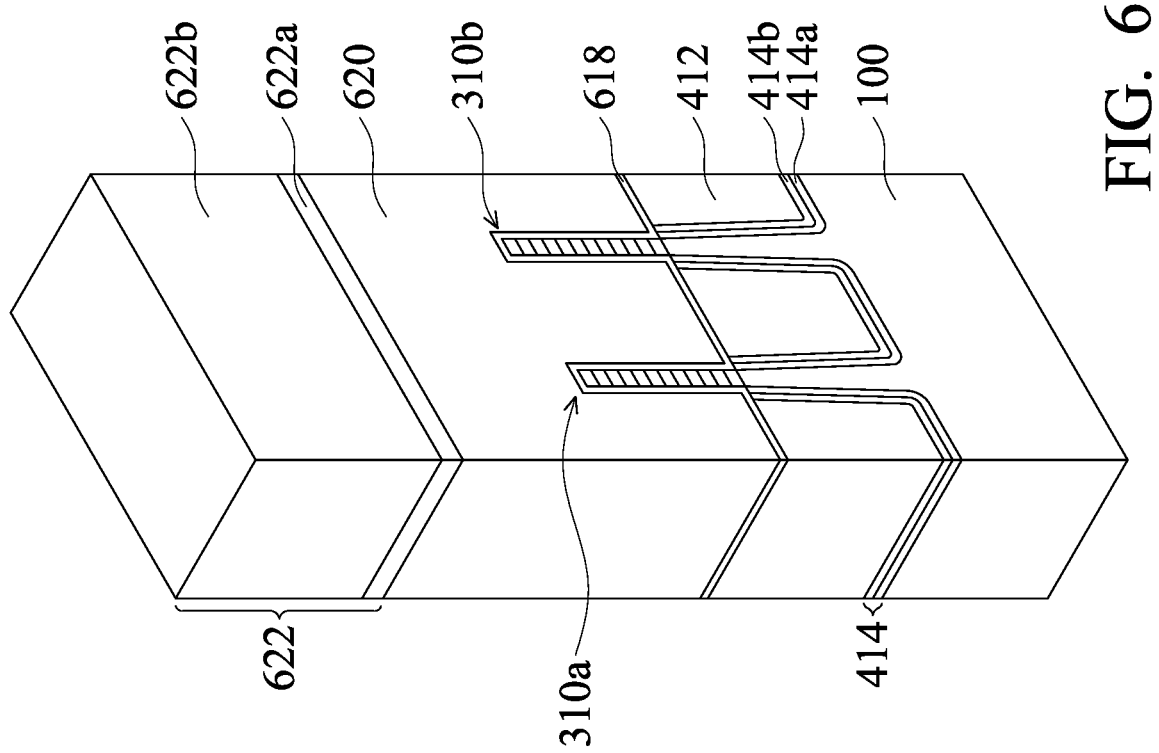

Referring to FIG. 6, a dummy gate dielectric layer 618 and a dummy gate electrode layer 620 are formed over the exposed fins 310 in accordance with some embodiments. The dummy gate dielectric layer 618 and the dummy gate electrode layer 620 will be subsequently patterned to form a dummy gate stack, which will be used to define and form the source/drain regions. The dummy gate stack will then be removed to allow processing to be performed to the fins in the channel region, and a gate stack will be formed over the channel region.

In some embodiments, the dummy gate dielectric layer 618 is formed over the exposed fins 310. The dummy gate dielectric layer 618 may be formed by thermal oxidation, CVD, sputtering, or any other methods known and used in the art for forming a dummy gate dielectric layer. In some embodiments, the dummy gate dielectric layer 618 may be formed of a same material as the STIs 412. In other embodiments, the dummy gate dielectric layer 618 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate dielectric layer 618 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

Subsequently, the dummy gate electrode layer 620 is formed over the dummy gate dielectric layer 618. In some embodiments, the dummy gate electrode layer 620 is a conductive material and may be selected from a group comprising polycrystalline-silicon (poly-Si), polycrystalline silicon-germanium (poly-SiGe), metallic nitrides, metallic silicides, metallic oxides, and metals. In an embodiment, the dummy gate electrode layer 620 may be deposited by PVD, CVD, sputter deposition, or other techniques known and used in the art for depositing conductive materials. Other materials, conductive and non-conductive, may be used. The top surface of the dummy gate electrode layer 620 usually has a non-planar top surface and may be planarized after it is deposited.

Figure 7:
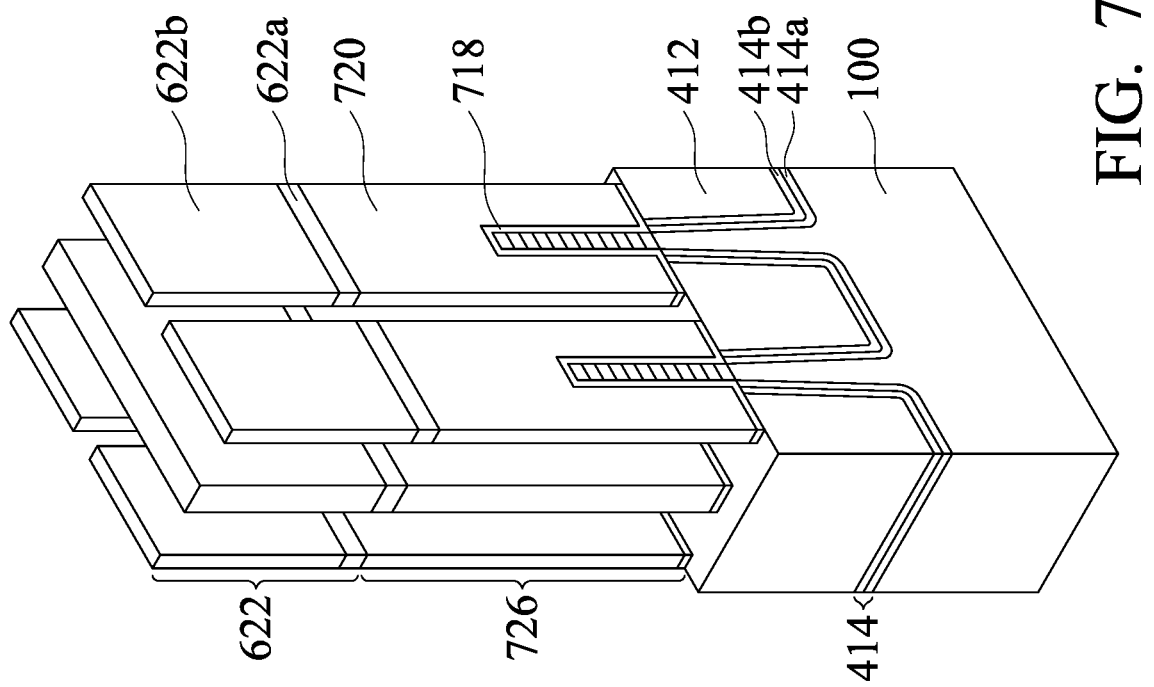

Also shown in FIG. 6 is a hardmask layer 622 formed over the dummy gate electrode layer 620. The hardmask layer 622 comprises one or more masking layers and will be used to pattern the dummy gate electrode layer 620 to form a dummy gate electrode. The hardmask layer 622 may comprise one or more patterning layers. In some embodiments, the hardmask layer 622 comprises a first hardmask layer 622a and a second hardmask layer 622b. The first hardmask layer 622a may be an oxide layer (e.g., silicon oxide) and the second hardmask layer 622b may be a nitride (e.g., silicon nitride). The first hardmask layer 622a and the second hardmask layer 622b may be deposited through a process such as CVD, or a spin-on-glass process, although any acceptable process may be utilized. The first hardmask layer 622a may have a thickness from about 10 Å to about 50 Å and the second hardmask layer 622b may have a thickness from about 150 Å to about 850 Å. FIG. 7 illustrates patterning of the dummy gate electrode layer 620 and the dummy gate dielectric layer 618 to form a dummy gate electrode 720 and a dummy gate dielectric 718. The dummy gate electrode 720 and the dummy gate dielectric 718 collectively form a dummy gate stack 726.

Figure 8A:
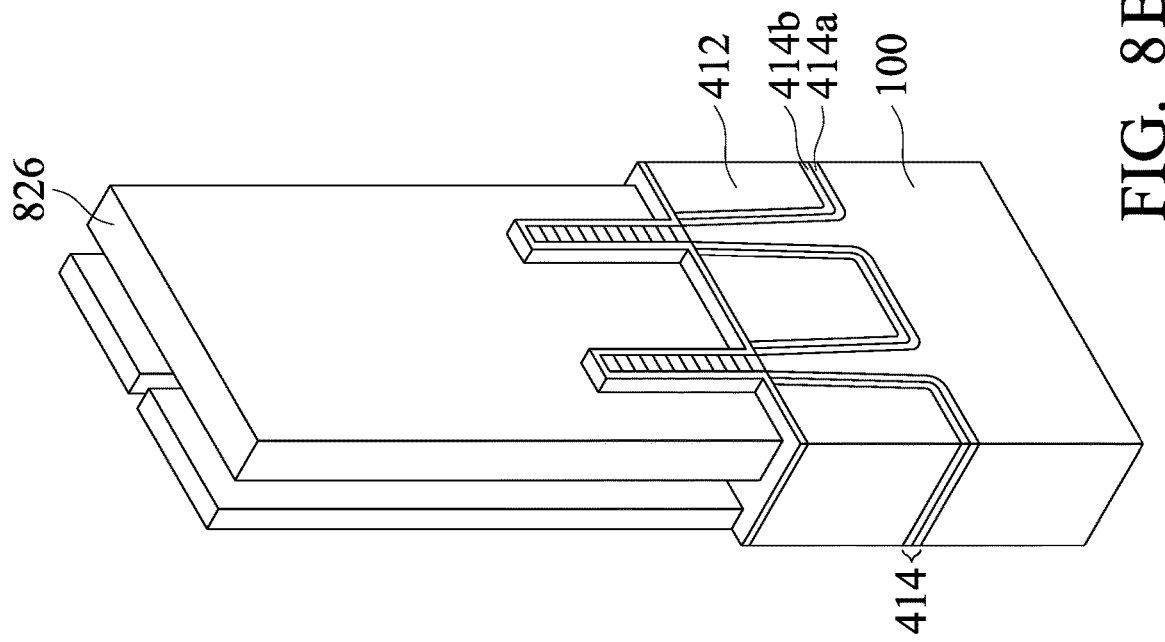
Figure 8B:
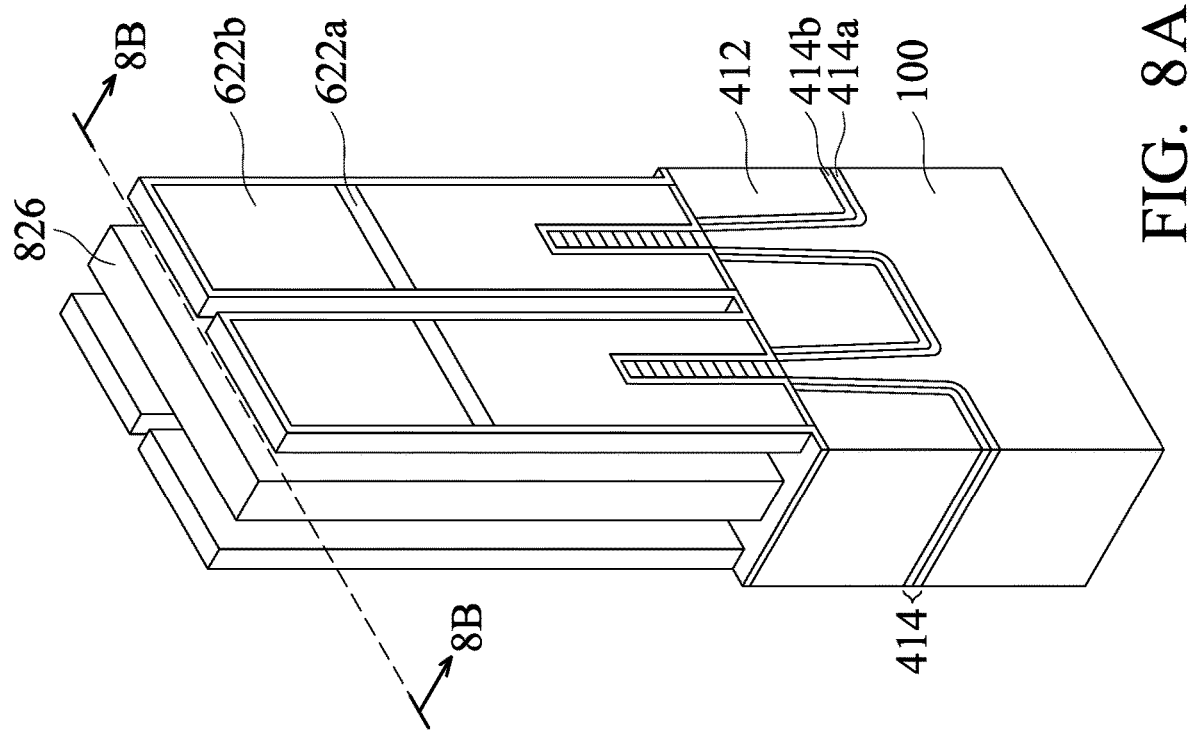

Referring now to FIGS. 8A and 8B, a spacer layer 826 is deposited over the dummy gate stacks 726, the fins 310, and the STIs 412. FIG. 8B illustrates a cross-section perpendicular to the source/drain regions between adjacent ones of the dummy gate stacks 726 as illustrated by the 8B-8B line in FIG. 8A. In some embodiments, spacer layer 826 is formed of silicon nitride, and may have a single-layer structure. In alternative embodiments, the spacer layer may have a composite structure including a plurality of layers. For example, the spacer layer may include a silicon oxide layer and a silicon nitride layer over the silicon oxide layer.

Figure 9:
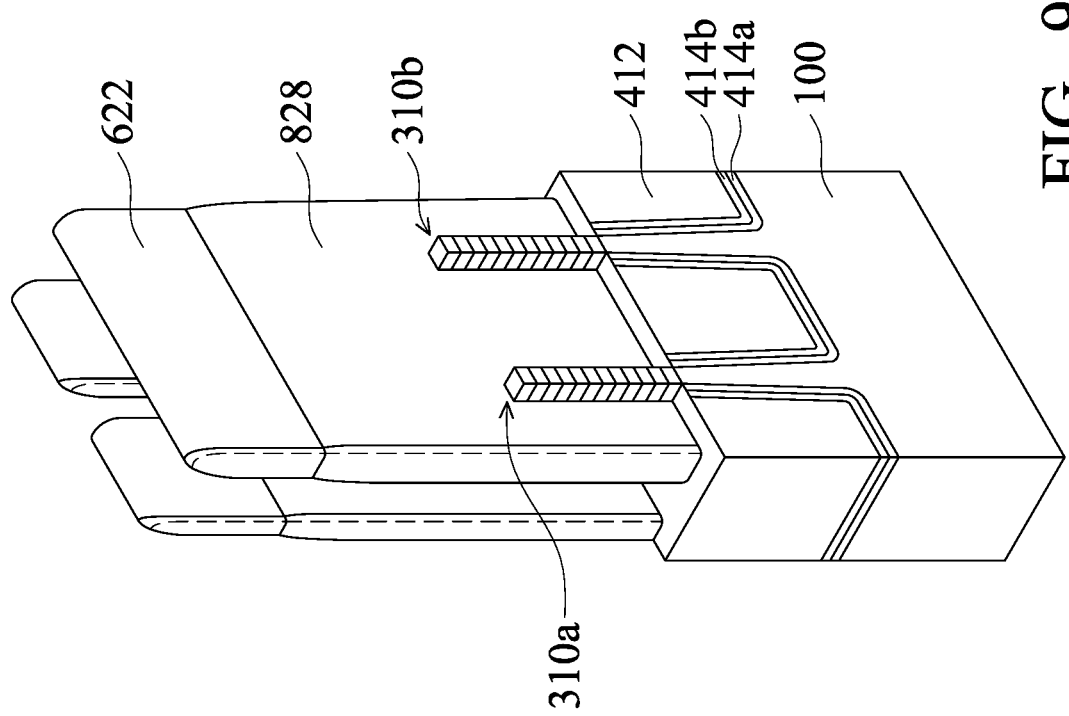

Referring now to FIG. 9, the spacer layer 826 (see FIGS. 8A and 8B) is patterned to form sidewall spacers 828 along sidewalls of the dummy gate stack 726 in accordance with some embodiments. In some embodiments, an anisotropic etch process is utilized to remove the spacer layer over horizontal portions of the device and along sidewalls of the dummy gate stacks 726. Due to the difference in the thicknesses of the spacer layer 826 over horizontal portions of the device and along sidewalls of the fins 310, the spacer layer 826 remains along sidewalls of the dummy gate stacks 726 while the fins 310 are exposed in the source/drain regions as illustrated in FIG. 9.

Figure 10:
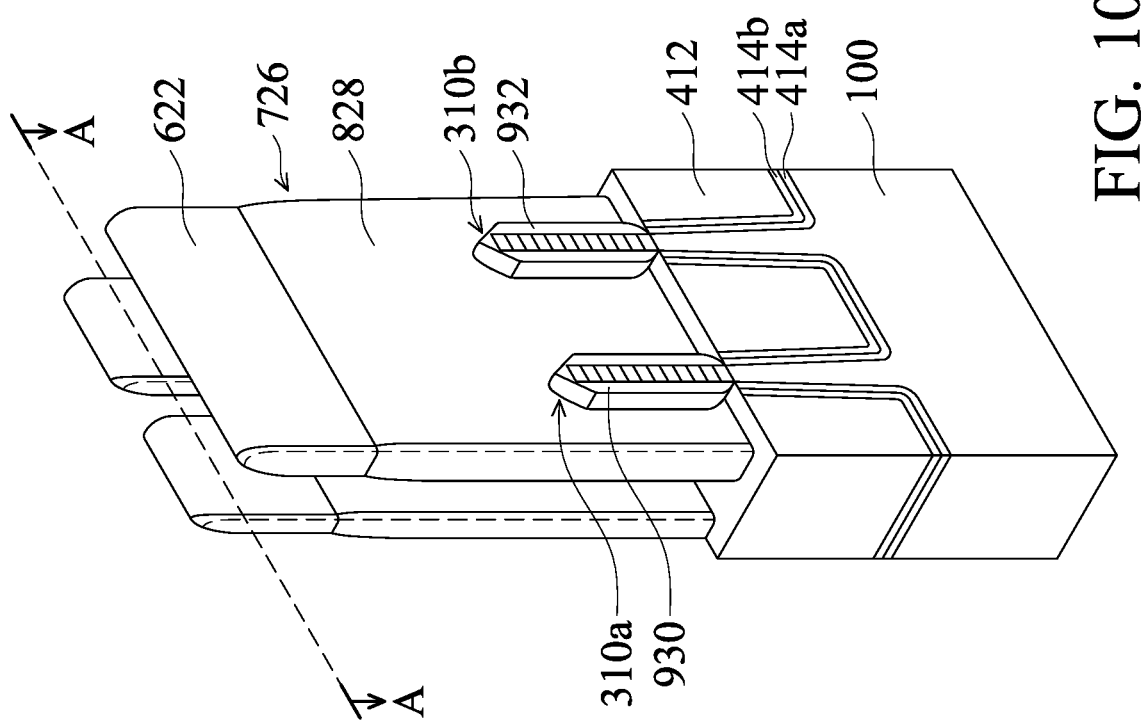

FIG. 10 illustrates epitaxial first source/drain regions 930 and second source/drain regions 932 formed on exposed portions of the first fin 310a and the second fin 310b, respectively, along opposing sides of the dummy gate stack 726 in accordance with some embodiments. The use of epitaxial grown materials in the source/drain regions allows for the source/drain regions to exert stress in the channel regions, in addition to the stress caused by the alternating epitaxial layer structure 102. The materials used for the first source/drain regions 930 and the second source/drain regions 932 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. Other materials may be used.

In embodiments in which different materials are utilized for the n-type devices and the p-type devices, it may be desirable to mask one (e.g., the n-type fins) while forming the epitaxial material on the other (e.g., the p-type fins), and repeating the process for the other. The first source/drain regions 930 and the second source/drain regions 932 may be doped either through an implanting process to implant appropriate dopants, or by in-situ doping as the material is grown. In some embodiments, the first source/drain regions 930 are formed of SiGe or Ge doped with boron (B) to form a p-type FinFET device, and the second source/drain regions 932 are formed of SiC or SiP doped with phosphorus (P) to form an n-type FinFET device.

Although FIG. 10 only illustrates the first source/drain regions 930 and the second source/drain regions 932 on one side of the dummy gate stacks 726, the first source/drain regions 930 and the second source/drain regions 932 on the opposite sides of the dummy gate stacks have a similar structural configuration.

Figure 11:
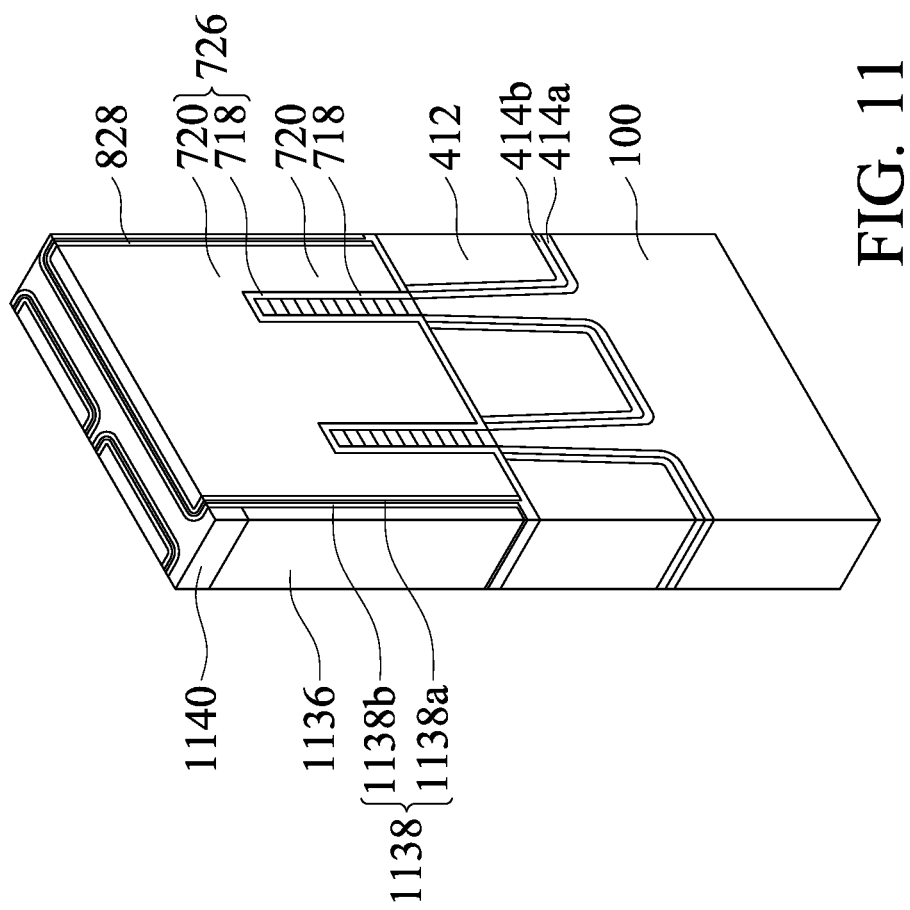

Next, as shown in FIG. 11, a first inter-layer dielectric (ILD) 1136 is formed over the structure illustrated in FIG. 10. It should be noted that FIGS. 1-10 cross sections are taken through the source/drain regions (except where otherwise noted) to illustrate the formation of the source/drain regions. FIGS. 11-25 are directed toward processing steps performed on the channel regions, and as such, FIGS. 11-25 are taken along the gate electrode illustrated by the A-A line in FIG. 10.

In some embodiments, a protective layer 1138 may be conformally deposited over the first source/drain regions 930 and the second source/drain regions 932 to protect the first source/drain regions 930 and the second source/drain regions 932 during the subsequent formation of contacts through the first ILD 1136 to the first source/drain regions 930 and the second source/drain regions 932. In some embodiments, the protective layer 1138 has a bilayer structure comprising a first protective sub-layer 1138a and a second protective sub-layer 1138b as illustrated in FIG. 11. In some embodiments, the first protective sub-layer 1138a comprises silicon oxide and has a thickness between about 10 Å and about 30 Å, and the second protective sub-layer 1138b comprises silicon nitride and has a thickness between about 20 Å and about 60 Å. The protective layer 1138 may be deposited through one or more processes such as PVD, CVD, or ALD, although any acceptable process may be utilized. Other materials and/or processes may be used.

In some embodiments, the first ILD 1136 may comprise silicon oxide, silicon nitride, the like, or a combination thereof. The first ILD 1136 may be formed by CVD, a high density plasma (HDP), the like, or a combination thereof. Subsequently, the first ILD 1136 may be planarized to be substantially coplanar with top surfaces of the dummy gate electrode 720. In an embodiment, the first ILD 1136 is planarized by using, for example, a CMP to remove portions of the first ILD 1136. In other embodiments, other planarization techniques may be used, such as etching.

In some embodiments, the first ILD 1136 is recessed, and protective layer 1140 is deposited, followed by a planarization step, resulting in the structure illustrated in FIG. 11. Protective layer 1140 may comprise silicon nitride ($Si_3N_4$), which protects first ILD 1136 and the underlying structures in the subsequent process steps.

Figure 12:
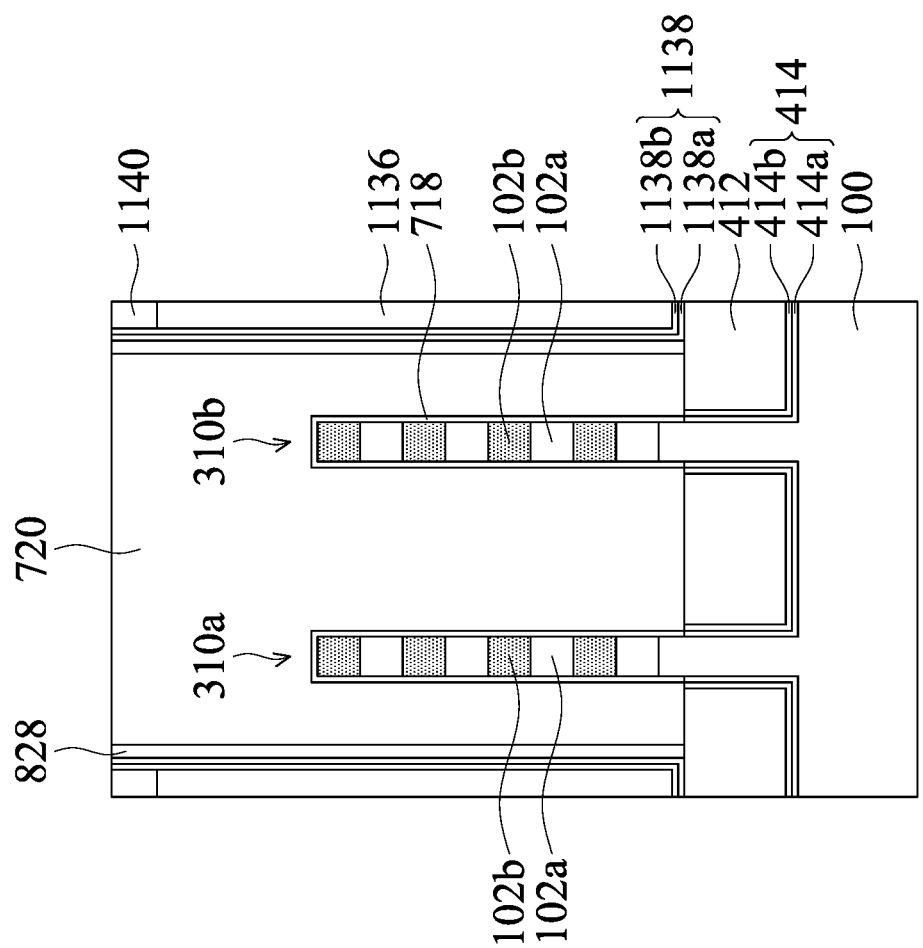

FIG. 12 illustrates a cross-sectional view of the structure in FIG. 11 along the dummy gate electrode 720. For ease of illustration, FIGS. 12-23 are shown in cross-sectional view to better and more clearly illustrate the processing of the channel region.

Figure 13:
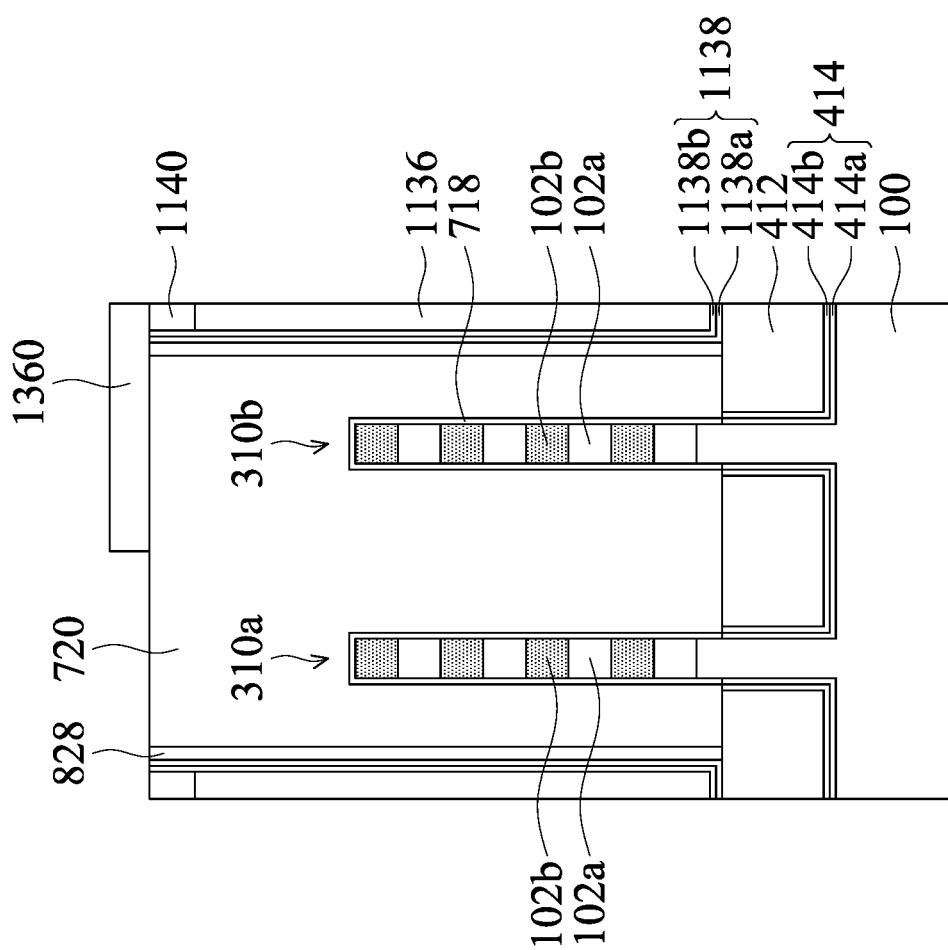

FIG. 13 illustrates formation of a patterned mask 1360 over the second fin 310b in accordance with some embodiments. As will be discussed in greater detail below, the channel regions of the first fin 310a and the second fin 310b will be processed separately. In particular, in some embodiments the first fin 310a will form p-type FinFET device and the first fins 310a are processed to thin or recess the second epitaxial layer 102b, and the second fins 310b are processed to remove the first epitaxial layer 102a. The patterned mask 1360 may be formed of any suitable masking material exhibiting a sufficient etch selectivity to protect the underlying layers during the etch process. For example, in some embodiments the patterned mask 1360 comprises a layer of silicon nitride with a thickness between about 10 Å and about 100 Å. In other embodiments, the patterned mask 1360 has a silicon oxide with a thickness between about 5 Å and about 50 Å, and a silicon nitride layer over the silicon oxide layer with a thickness between about 5 Å and about 50 Å. The patterned mask 1360 may be deposited through one or more processes such as PVD, CVD, or ALD, although any acceptable process may be utilized, and patterned using photolithography techniques. Other materials and/or processes may be used.

Figure 14:
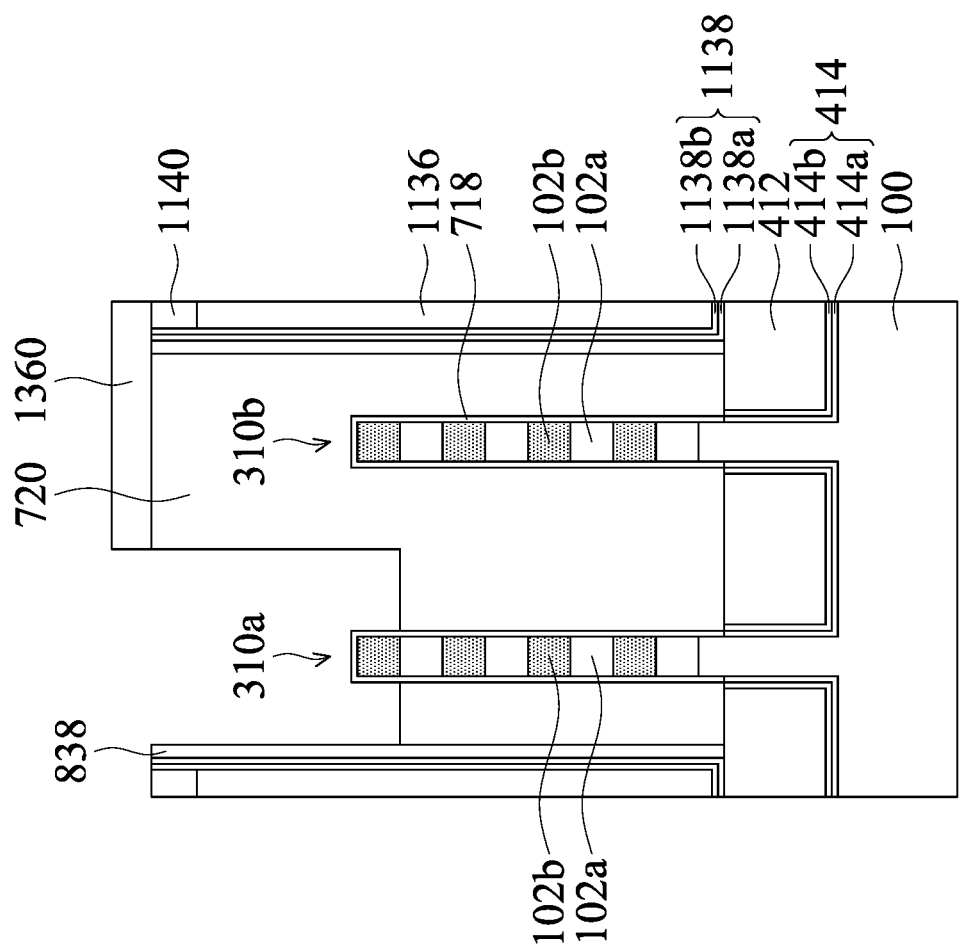

Thereafter, an etch process is performed to partially remove the dummy gate electrode 720 over the first fin 310a (e.g., the fin for the p-type device) as illustrated in FIG. 14 in accordance with some embodiments. In embodiments in which a p-type device of alternating layers of silicon and silicon germanium is being formed, the silicon germanium layers act as the channel region in which current flows in the p-type device. As such, it may be desirable for the uppermost layer to be that of silicon germanium (e.g., the current carrying layer), thereby allowing the subsequently formed overlying gate electrode to interact better with the uppermost layer, and in these embodiments, it may be desirable to remove a top layer of the first fin 310a (e.g., the uppermost second epitaxial layer 102b, silicon in this example). For example, in an embodiment in which the alternating epitaxial layer structure 102 comprises alternating layers of silicon germanium for the first epitaxial layer 102a and silicon for the second epitaxial layer 102b, it may be desirable for the uppermost layer of the first fin 310a be a layer of silicon germanium.

In some embodiments, the dummy gate electrode 720 is recessed by an etch process that is selective to the material of the dummy gate electrode 720. For example, if the dummy gate electrode 720 comprises polysilicon, a dry etch using $NF_3$, $SF_6$, $Cl_2$, HBr, the like, or a combination thereof or a wet etch using $NH_4OH$, tetramethylammonium hydroxide (TMAH), the like, or a combination thereof may be used to remove the dummy gate electrode 720. As illustrated in FIG. 14, the dummy gate electrode 720 is recessed to a depth such that the uppermost second epitaxial layer 102b extends above a bottom of the recess.

Figure 15:
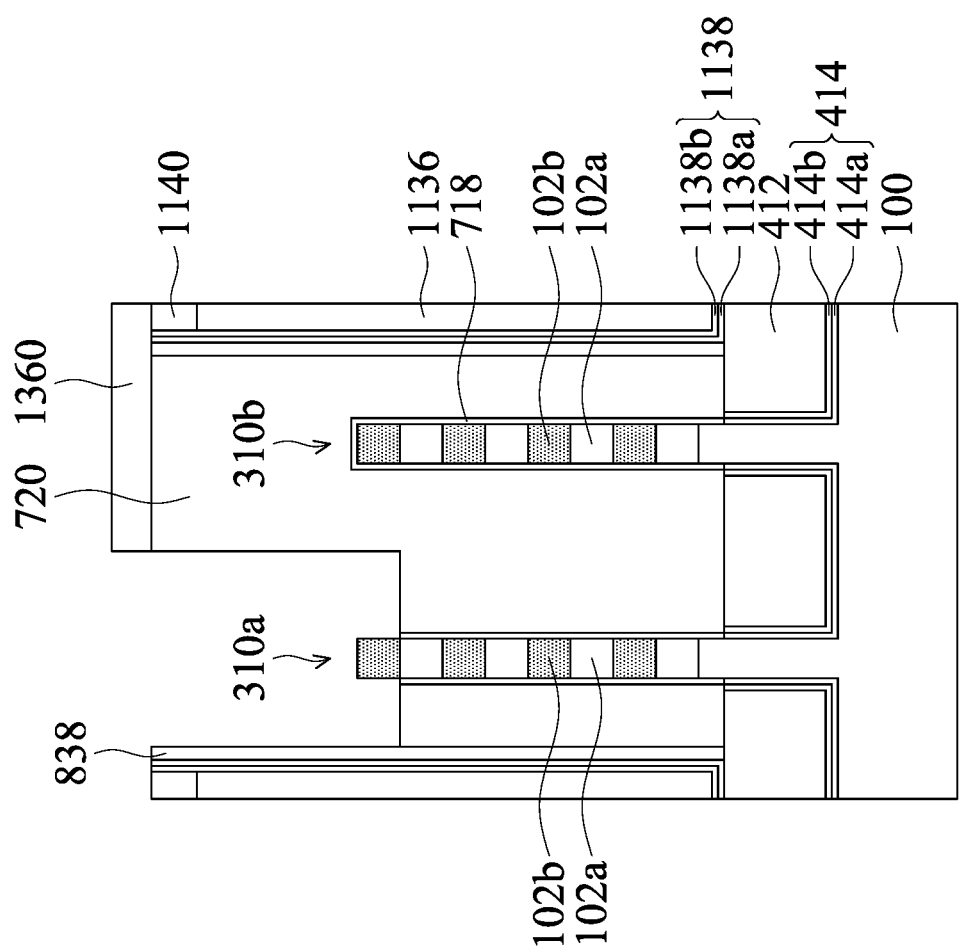
Figure 16:
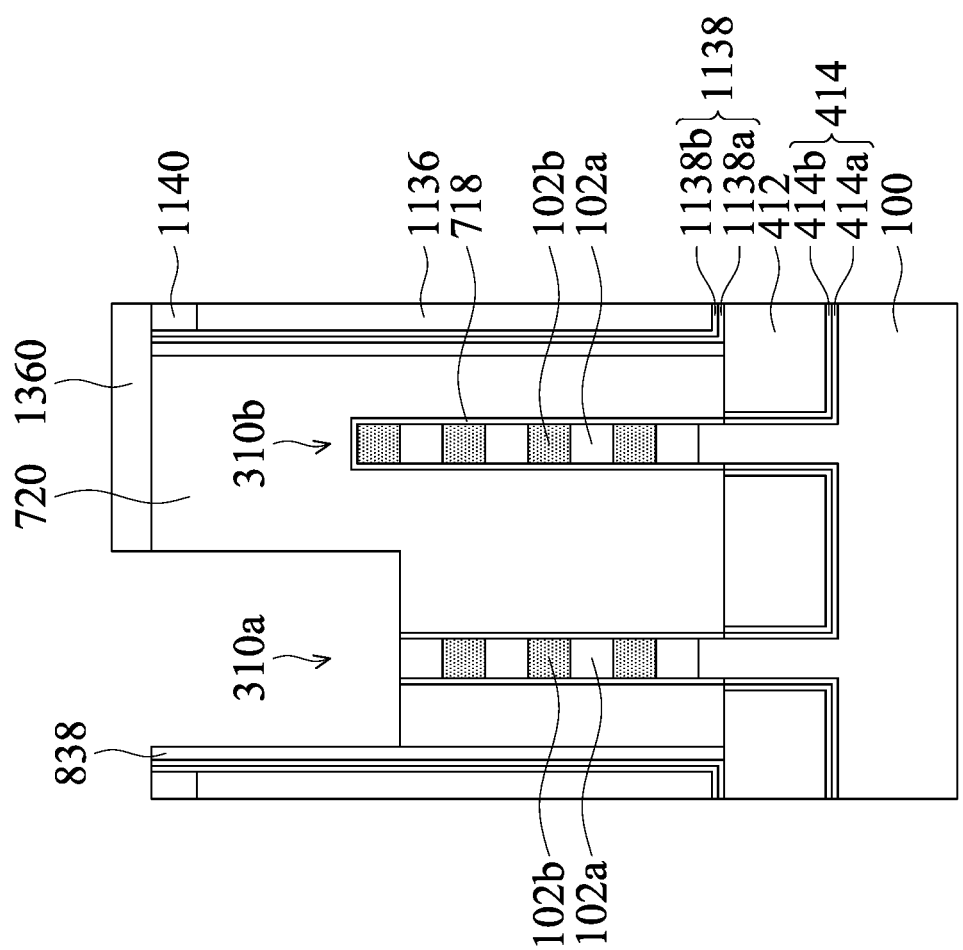

FIG. 15 illustrates the removal of the dummy gate dielectric 718 over the uppermost second epitaxial layer 102b and FIG. 16 illustrates removal of the uppermost second epitaxial layer 102b, in accordance with some embodiments. In embodiments in which the dummy gate dielectric 718 comprises silicon oxide, wet etch using a diluted HF acid may be used to remove the exposed portions of the dummy gate dielectric layer 618. In embodiments in which the second epitaxial layer 102b comprises silicon, a wet etch using a tetramethylammonium hydroxide (TMAH) solution may be used to remove the second epitaxial layer 102b. Other processes and materials may be used.

Figure 17:
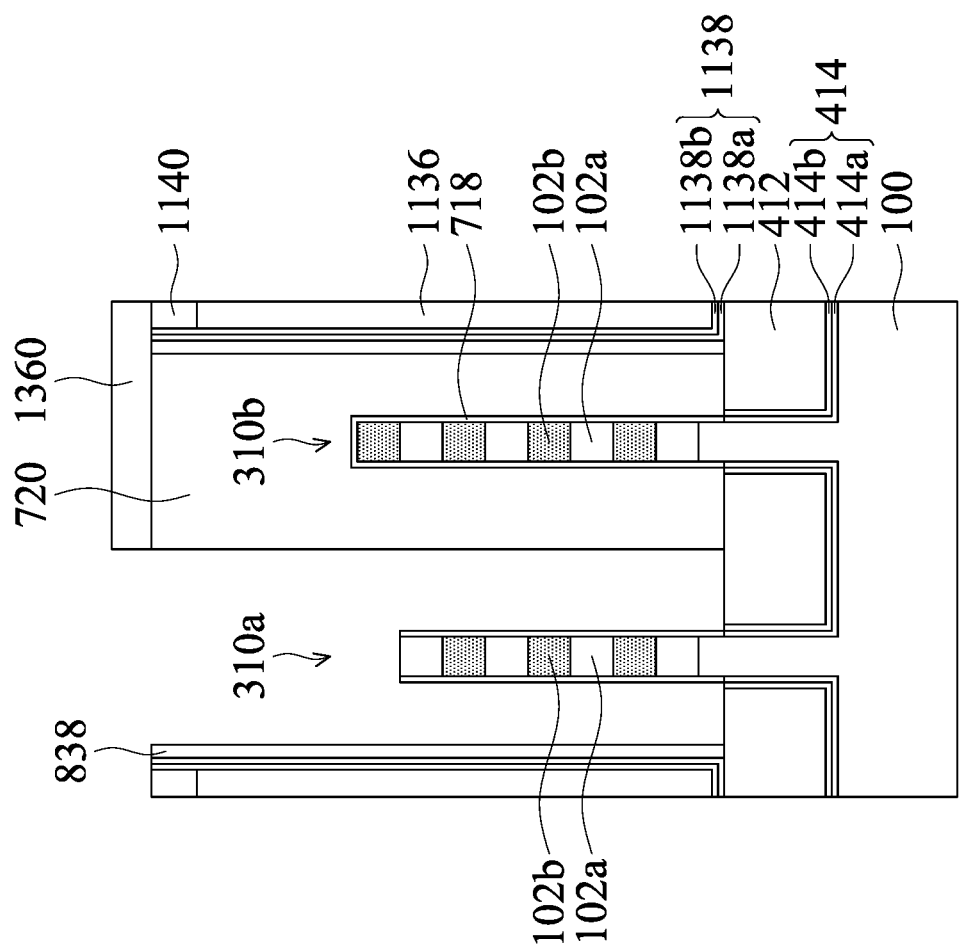

FIG. 17 illustrates the resulting structure after removal of the remainder of the dummy gate electrode 720 over the first fin 310a in accordance with some embodiments. The etch process described above may be used to remove the remainder of the dummy gate electrode 720 over the first fin 310a.

Figure 18:
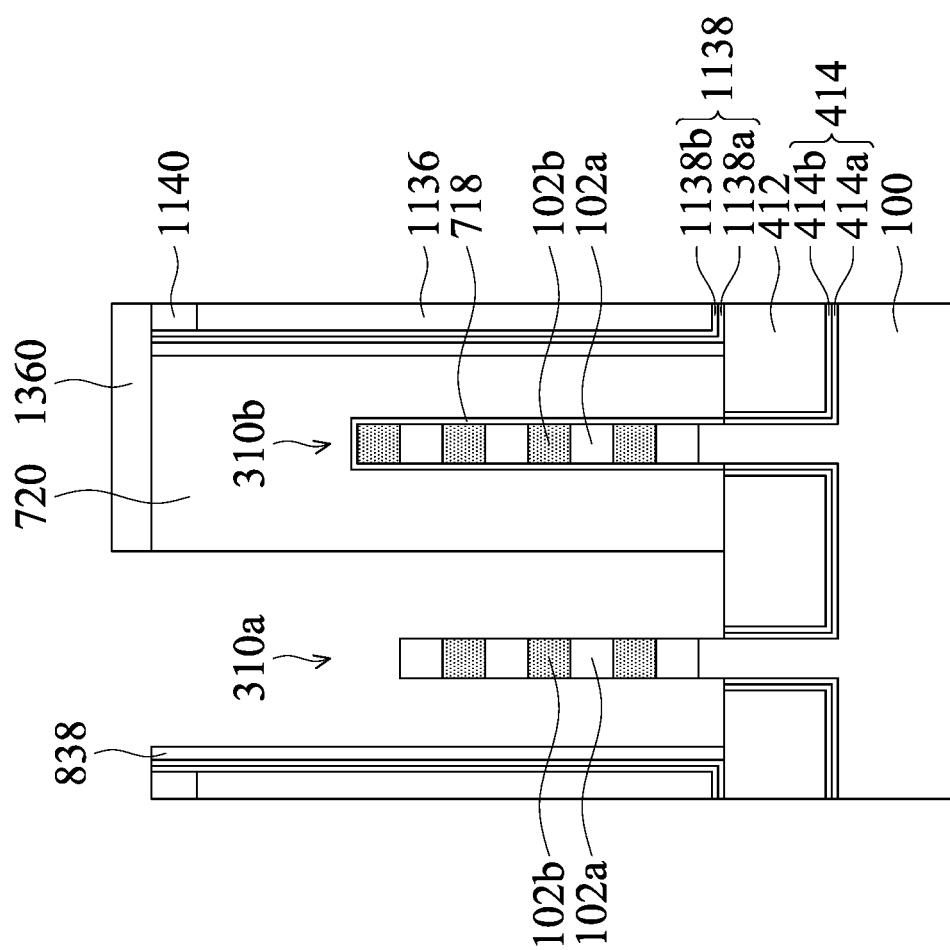

Referring now to FIG. 18, the dummy gate dielectric 718 (see FIG. 17) is removed from along the sidewalls of the first fin 310a in accordance with some embodiments. As discussed above, the second epitaxial layers 102b are thinned or recessed. Accordingly, the dummy gate dielectric 718 is removed to expose the second epitaxial layers 102b. In embodiments in which the dummy gate dielectric 718 comprises silicon oxide, wet etch using a diluted HF acid may be used to remove the exposed portions of the dummy gate dielectric 718.

Figure 19:
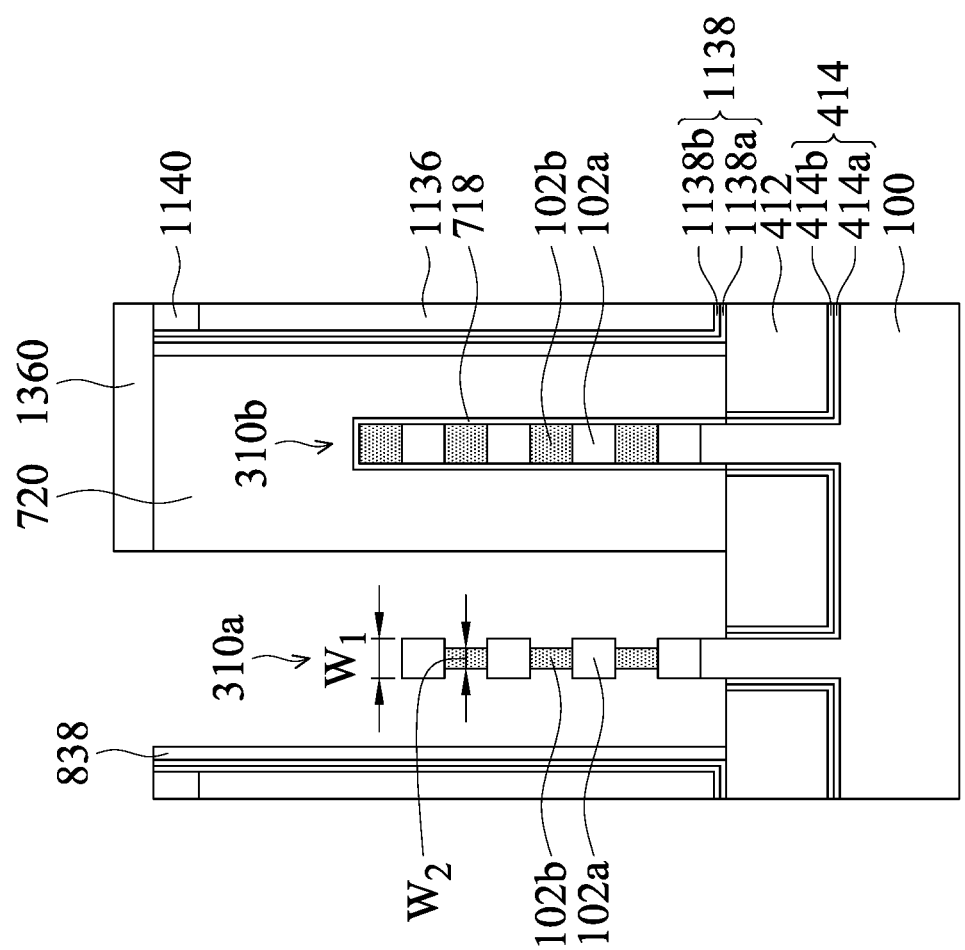

FIG. 19 illustrates recessing of the second epitaxial layers 102b in the first fin 310a in accordance with some embodiments. In embodiments in which the first epitaxial layers 102a are formed of silicon germanium and the second epitaxial layers 102b are formed of silicon, the second epitaxial layers 102b may be recessed using a wet etch using a tetramethylammonium hydroxide (TMAH) solution. Other processes and materials may be used.

A width $W_1$ of the first epitaxial layers 102a and a width $W_2$ of the second epitaxial layers 102b may be adjusted such that sufficient gate control is achieved on the first epitaxial layers 102a as well as a desired stress applied to the first epitaxial layers 102a from the second epitaxial layers 102b. In some embodiments, the width $W_1$ of the first epitaxial layers 102a is from about 5 nm to about 10 nm, and the width $W_2$ of the second epitaxial layers 102b is from about 1 nm to about 7 nm.

Figure 20:
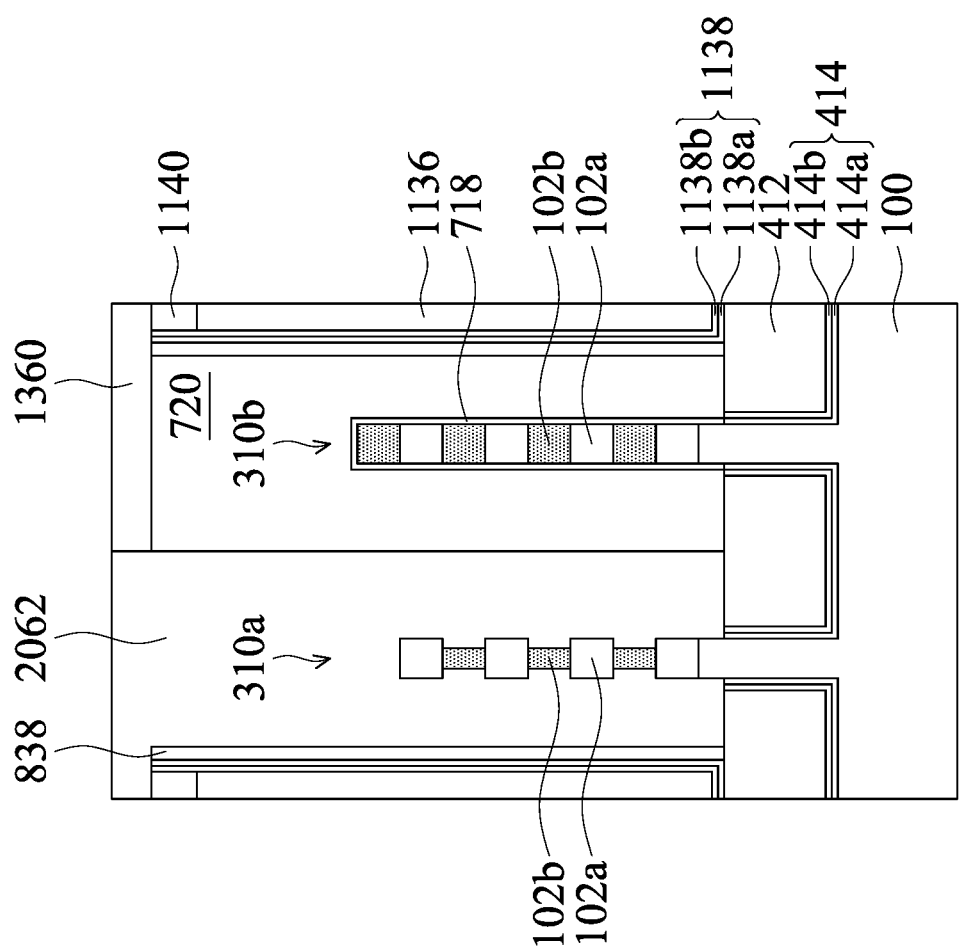

Referring now to FIG. 20, the first fin 310a is protected by a protective mask 2062 in accordance with some embodiments. The protective mask 2062 protects the first fin 310a while processing is performed on the second fin 310b. In this example, the first fin 310a will form a p-type FinFET having alternating layers of epitaxial material, while the second fin 310b will be processed to remove the first epitaxial layers 102a to form nanowires of the second epitaxial layers 102b. In some embodiments, the protective mask 2062 is a silicon oxide material formed through a process such as CVD, flowable CVD (FCVD), or a spin-on-glass process, although any acceptable process may be utilized. Optionally, a CMP process or other planarizing process may be performed to remove material over the patterned mask 1360. Other materials and processes may be used.

Figure 21:
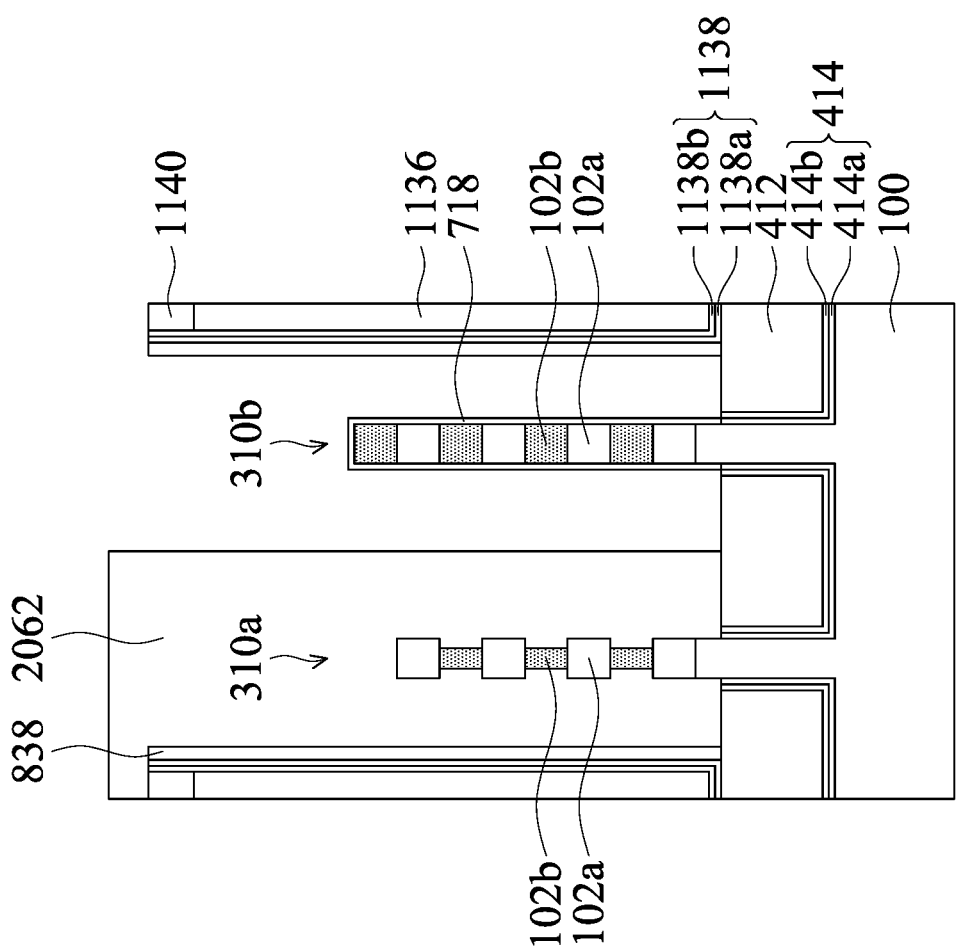

Thereafter, as illustrated in FIG. 21, the patterned mask 1360 and the dummy gate electrode 720 over the second fin 310b may be removed in accordance with some embodiments. In some embodiments in which the patterned mask 1360 comprises silicon nitride, the patterned mask 1360 may be removed using $H_3PO_4$. The dummy gate electrode 720 may be removed using similar processes as discussed above.

Figure 22:
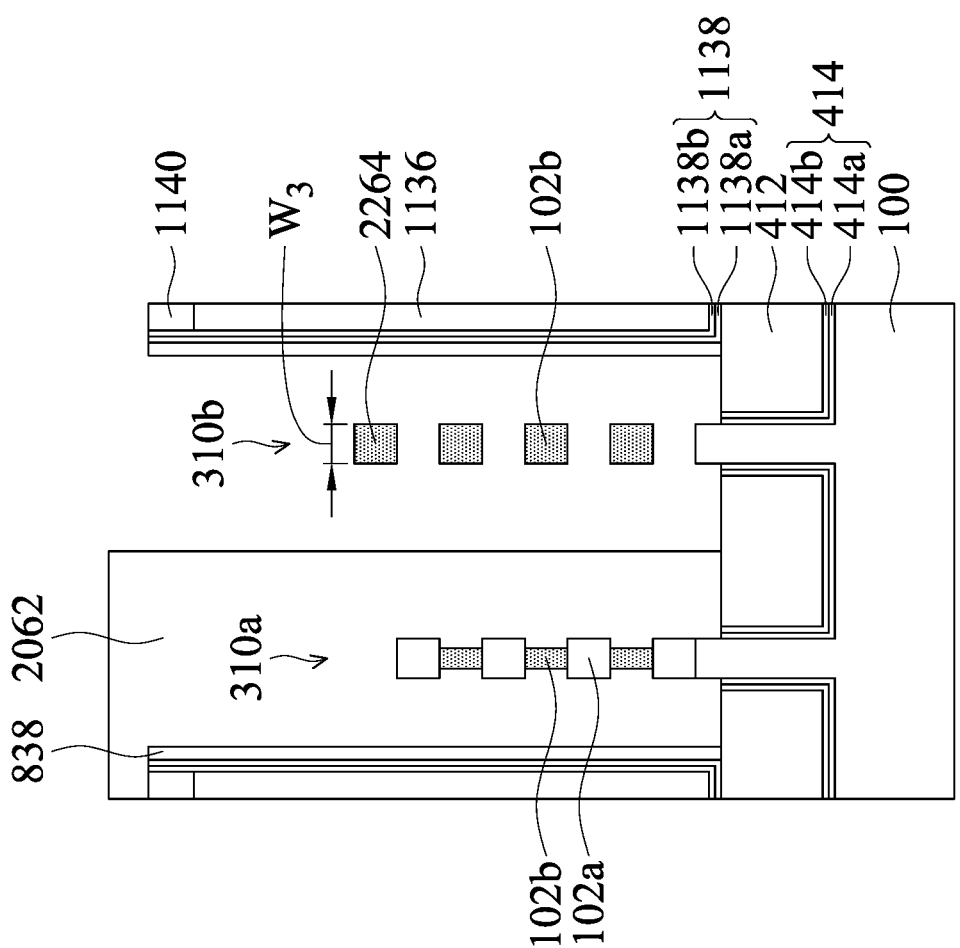
Figure 23:
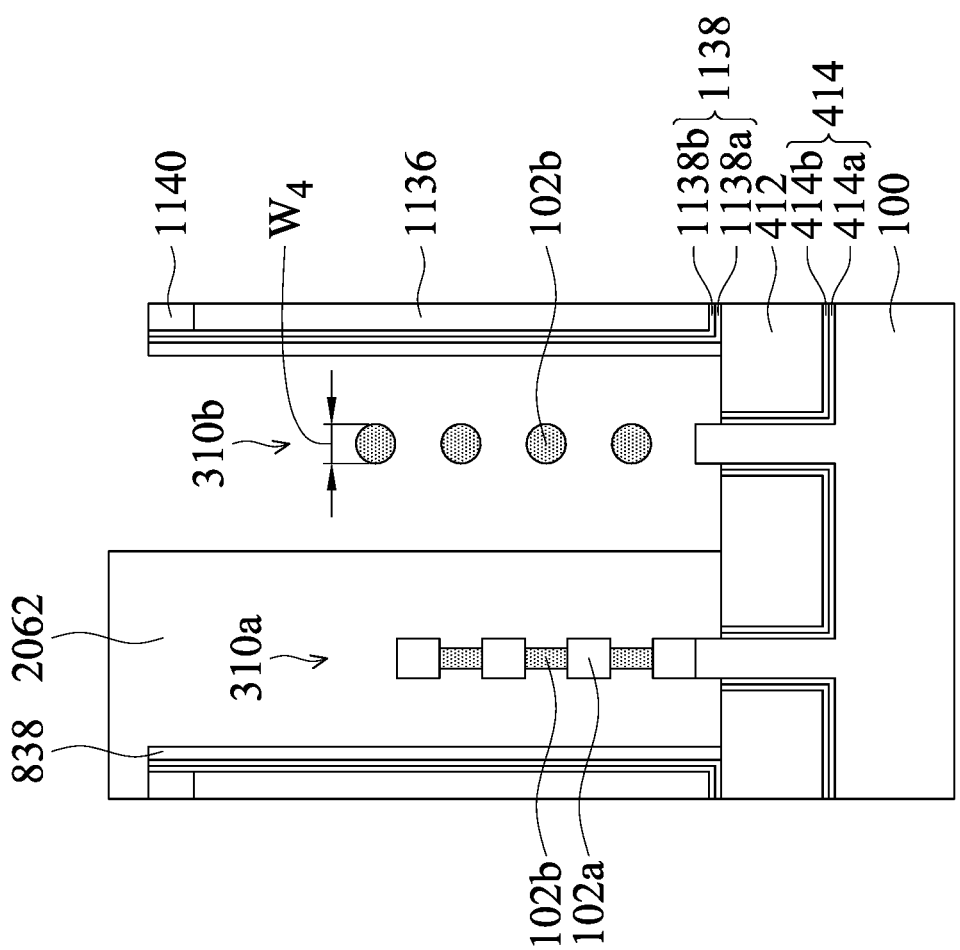

FIGS. 22 and 23 illustrate the removal of the dummy gate dielectric 718 over the second fin 310b and the subsequent removal of the first epitaxial layers 102a in accordance with some embodiments. The removal of the dummy gate dielectric 718 exposes the second fin 310b, thereby allowing removal of the first epitaxial layer 102a. The dummy gate dielectric 718 over the second fin 310b may be removed using similar processes and materials as the removal of the dummy gate dielectric 718 over the first fin 310a discussed above.

In embodiments in which the first epitaxial layers 102a are formed of silicon germanium and the second epitaxial layers 102b are formed of silicon, the first epitaxial layers 102a may be removed using an etchant that etches the silicon germanium at a higher rate than the silicon, such as $NH_4OH:H_2O_2:H_2O$ (ammonia peroxide mixture, APM), $H_2SO_4+H_2O_2$ (sulfuric acid peroxide mixture, SPM), or the like. This etching process removes the first epitaxial layers 102a, thereby forming nanowires 2264.

Optionally, a rounding process may be performed to obtain rounded nanowires as illustrated in FIG. 23. The rounding process may be performed, for example, using a thermal oxidation process at a temperature of about 300° C. to about 700° C. in an ambient of $O_2$ and a pressure of about 0.5 torr to about 20 torr. The oxidation layer may be removed using HF or annealing in an ambient of $H_2$ at a temperature from about 250° C. to about 600° C. with a pressure from about 1 torr to about 100 torr to expose the underlying semiconductor material. In some embodiments, a width $W_3$ of the second epitaxial layers 102b prior to removal of the first epitaxial layers 102a is from about 5 nm to about 10 nm, and a $W_4$ of the second epitaxial layers 102b after rounding is from about 1 nm to about 7 nm.

Figure 24B:
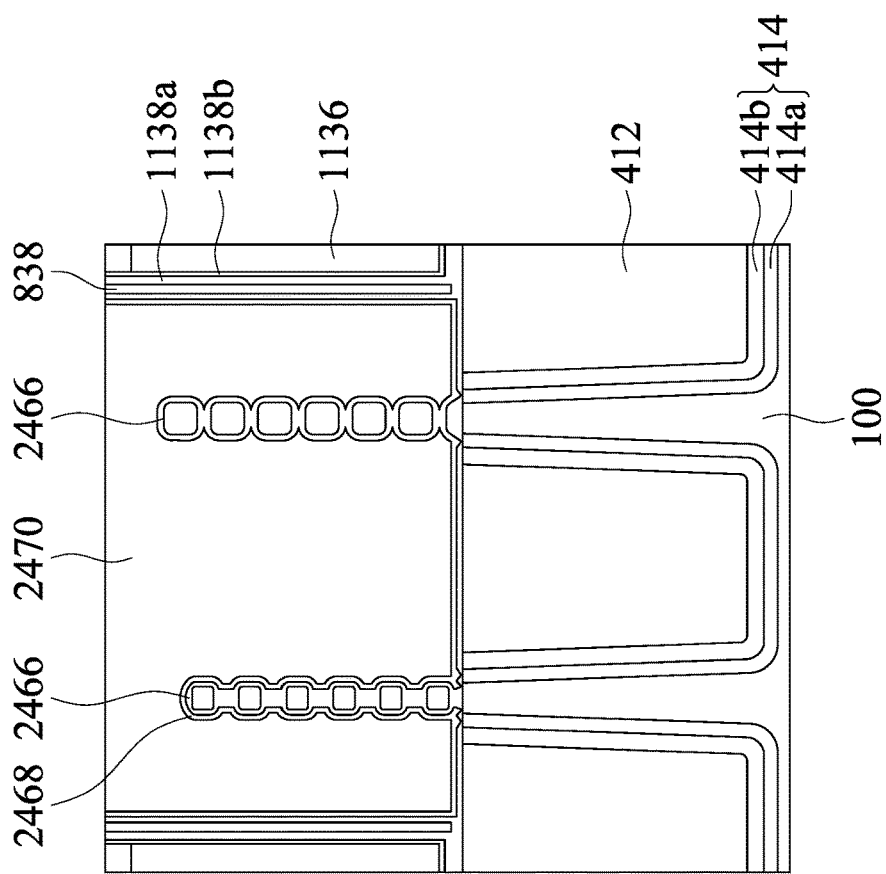
Figure 24A:
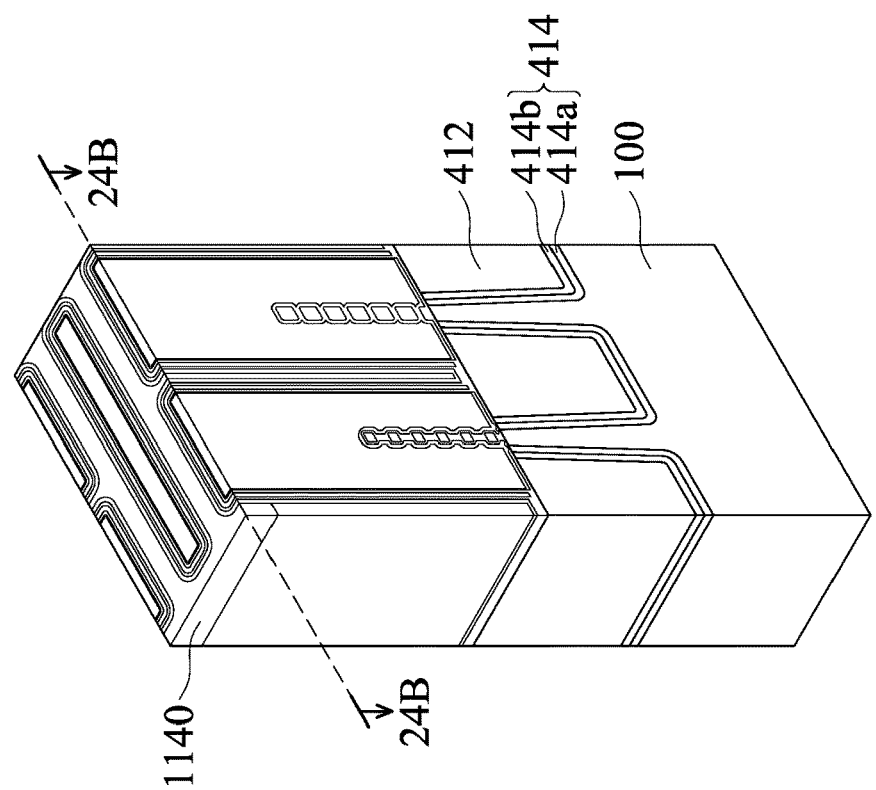

FIGS. 24A and 24B illustrate formation of an interfacial layer 2466 formed along a surface of the first fin 310a and the nanowires 2264 in accordance with some embodiments. FIG. 24A is a perspective view and FIG. 24B is a cross-sectional view taken along the 24B-24B line of FIG. 24A. The interfacial layer 2466 helps buffer a subsequently formed high-k dielectric layer from the underlying semiconductor material. In some embodiments, the interfacial layer 2466 is a chemical silicon oxide, which may be formed of chemical reactions. For example, a chemical oxide may be formed using deionized water+ozone ($DIO_3$), $NH_4OH+H_2O_2+H_2O$ (APM), or other methods. Other embodiments may utilize a different material or processes for the interfacial layer 2466. In an embodiment, the interfacial layer 2466 may have a thickness of about 3 Å to about 7 Å.

A gate dielectric layer 2468 is formed on the interfacial layer 2466. In an embodiment, the gate dielectric layer 2468 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, and the like. The formation methods of gate dielectric layer 2468 include molecular-beam deposition (MBD), ALD, PVD, and the like. In an embodiment, the gate dielectric layer 2468 may have a thickness of about 3 Å to about 30 Å.

FIGS. 24A and 24B further illustrate a gate electrode 2470 formed over the gate dielectric layer 2468. The gate electrode 2470 may be a metal selected from a group of W, Cu, Ti, Ag, Al, TiAl, TiAlN, TaC, TaCN, TaSiN, Mn, and Zr. In an alternative embodiment, the gate electrode 2470 comprises a metal selected from a group of TiN, WN, TaN, and Ru. In the present embodiment, the gate electrode 2470 has a thickness in the range of about 5 nm to about 100 nm. The gate electrode 2470 may be formed using a suitable process such as ALD, CVD, PVD, plating, or combinations thereof. A planarization process, such as a CMP, may be performed to remove excess materials.

Figure 25:
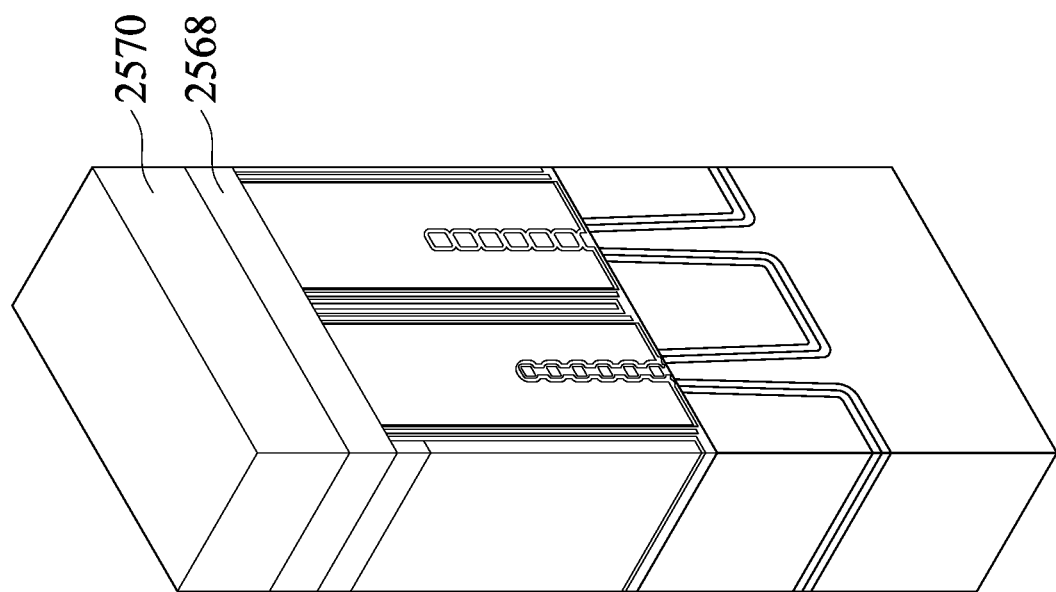
Figure 26:
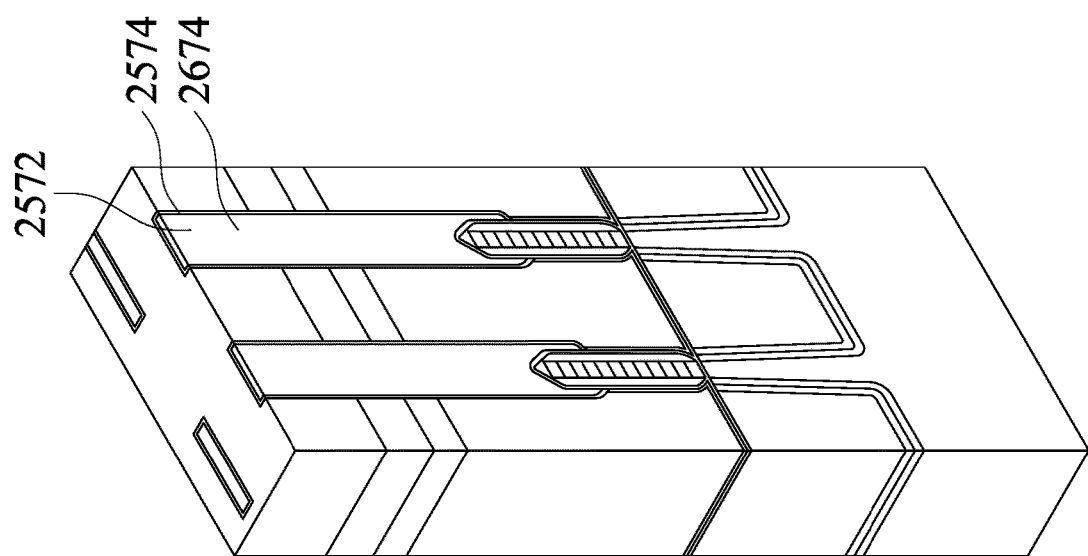

In FIGS. 25 and 26, one or more dielectric layers, such as an etch stop layer 2568 and a second ILD 2570, is formed over the structure, and contacts 2572 are formed through various dielectric layers to various components. The second ILD 2570 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A planarization process, such as a CMP, can be performed to planarize the second ILD 2570.

Openings for the contacts 2572 can be formed using photolithography techniques and one or more etching steps. A liner 2574, such as a diffusion barrier layer, an adhesion layer, or the like, and a conductive material 2674 are formed in the openings. The liner may include titanium, titanium nitride, tantalum, tantalum nitride, or the like formed by ALD, CVD, or the like. The conductive material may be copper, a copper alloy, silver, gold, tungsten, aluminum, nickel, or the like formed by ALD, CVD, PVD, or the like. A planarization process, such as a CMP, may be performed to remove excess material from a surface of the second ILD 2570.

Other embodiments may utilize different materials and/or shapes for the n-type FinFET and/or the p-type FinFET. For example, FIGS. 27A-27D illustrate various other embodiments that may be used for the n-type FinFET, other than the nanowire structure discussed above with reference to FIGS. 1-26, and FIGS. 28A-28D illustrate various other embodiments that may be used for the p-type FinFET discussed above with reference to FIGS. 1-26. It is noted that FIGS. 27A-28D illustrate a perspective view of the channel region and a source/drain region.

Embodiments such as those illustrated in FIGS. 27A-28D begin with processes similar to those discussed above with reference to FIG. 1, except a strain relaxed buffer (SRB) 2710 is formed prior to forming the alternating epitaxial layer structure 102, and the alternating epitaxial layer structure 102 is formed over the SRB 2710. In some embodiments, the SRB 2710 comprises a $Si_{0.75}Ge_{0.25}$ and may be grown by an LPCVD process performed at a temperature of about 400° C. to about 800° C. and under a pressure of about 1 to about 200 Torr, using $SiH_2Cl_2$ or $SiH_4$, $GeH_4$, and HCl, $B_2H_6$, or $H_2$ as reaction gases.

Thereafter, the alternating epitaxial layer structure 102 may be formed over the SRB 2710. In some embodiments, the first epitaxial layer 102a comprises $Si_{0.5}Ge_{0.5}$ grown by an LPCVD process performed at a temperature of about 400° C. to about 800° C. and under a pressure of about 1 to about 200 Torr, using $SiH_2Cl_2$ or $SiH_4$, $GeH_4$, and HCl, $B_2H_6$, or $H_2$ as reaction gases. The second epitaxial layer 102b comprises silicon, which may be grown by an LPCVD process performed at a temperature of about 400° C. to about 750° C. and under a pressure of about 10 to about 200 Torr, using $SiH_2Cl_2$ or $SiH_4$ as reaction gases. In these embodiments, the second epitaxial layer 102b has a larger lattice constant than the first epitaxial layer 102a, which has a larger lattice constant than the SRB 2710.

For the n-type FinFET structures, the silicon layers act as the channel region for the current flow between source and drain regions, and the $Si_{0.5}Ge_{0.5}$ causes the Si layers to be under a tensile strain, thereby increasing the efficiency of the n-type FinFET structures.

For the p-type FinFET structures, the $Si_{0.5}Ge_{0.5}$ layers act as the channel region for the current flow between source and drain regions, and the Si layers causes the $Si_{0.5}Ge_{0.5}$ layers to be under a compressive strain, thereby increasing the efficiency of the p-type FinFET structures.

Processes similar to those discussed above with reference to FIGS. 2-9 may be performed, wherein the trenches 312 (see FIG. 3) may extend at least partially into the SRB 2710, and may extend to the underlying substrate 100. As noted above, other materials may be used to form the epitaxial first source/drain regions 930 and the epitaxial second source/drain regions 932. For example, the material used to form the second source/drain regions 932 for n-type FinFET devices in FIGS. 27A-27D may comprise a SiGeP, which may be grown by an LPCVD process performed at a temperature of about 400° C. to about 800° C. and under a pressure of about 10 to about 200 Torr, using $SiH_4$ or $Si_2H_2Cl_2$, $GeH_4$ or $Ge_2H_2Cl_2$, and $PH_3$(phosphine) as reaction gases. The material used to form the first source/drain regions 930 for p-type FinFET devices in FIGS. 28A-28D may comprise a GeSn, which may be grown by an LPCVD process performed at a temperature of about 400° C. to about 700° C. and under a pressure of about 10 to about 200 Torr, using $GeH_4$, $SnCl_4$ as reaction gases. Thereafter, similar processes may be performed as described above with reference to FIGS. 11-26 wherein the etching processes described below is utilized to obtain the desired shapes.

Figure 27B:
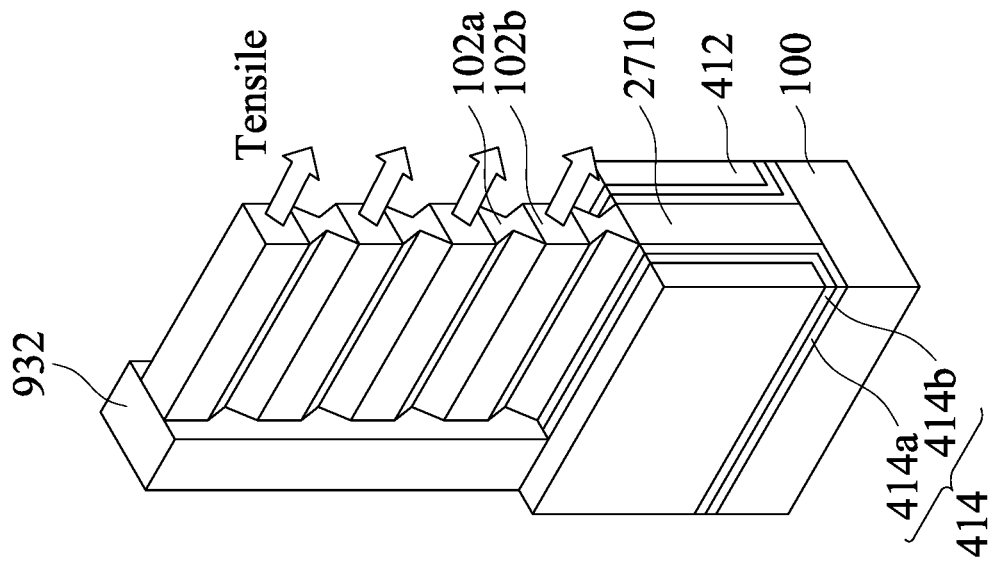
FIGS. 27A-27D illustrate perspective views of various configurations for n-type FinFETs in accordance with some embodiments.
Figure 27A:
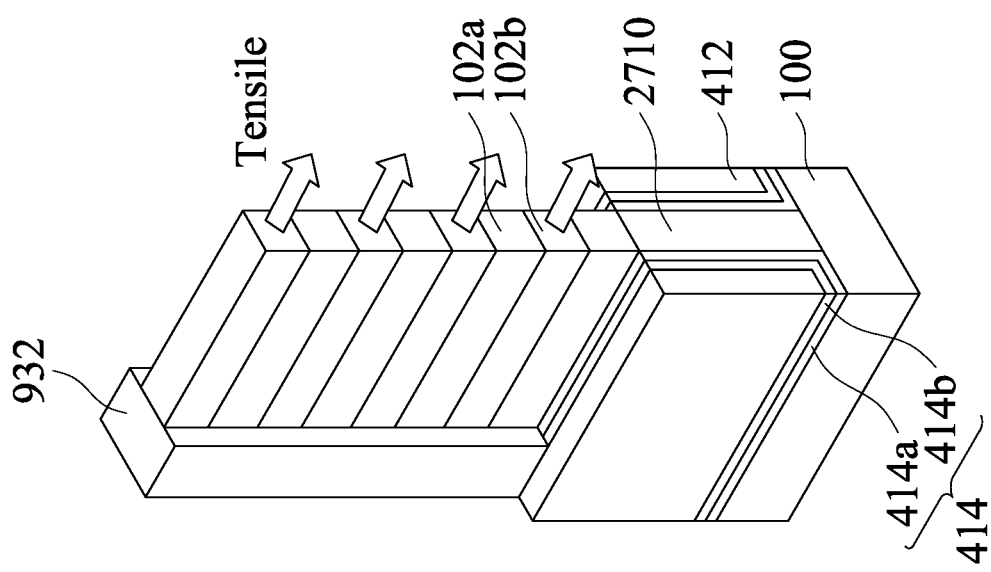
Figure 27C:
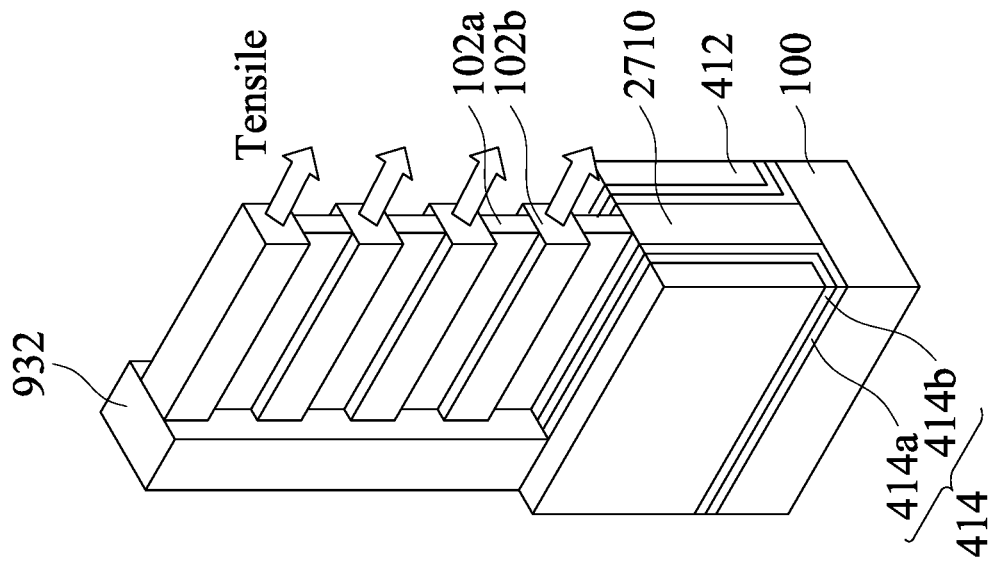
Figure 27D:
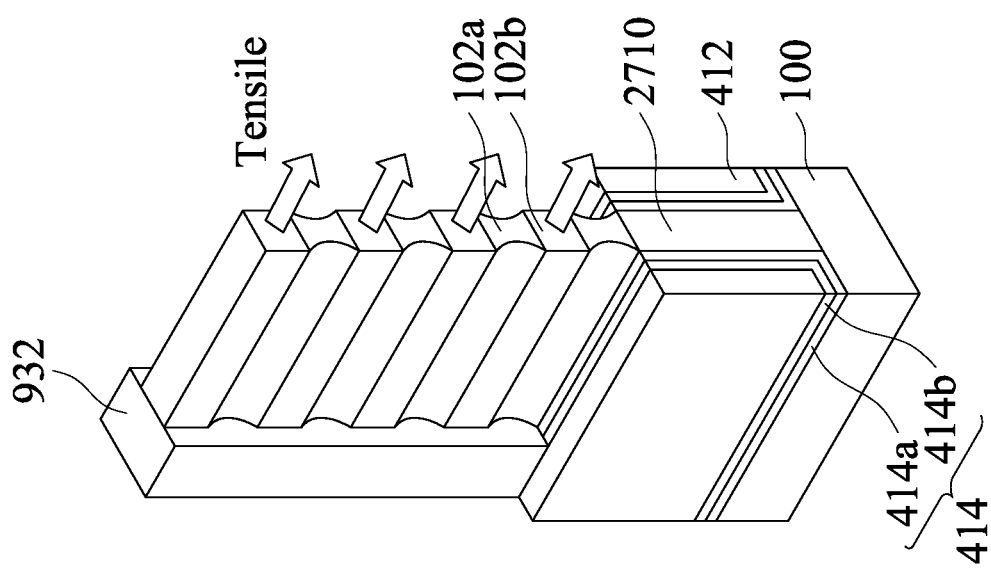
Figure 28A:
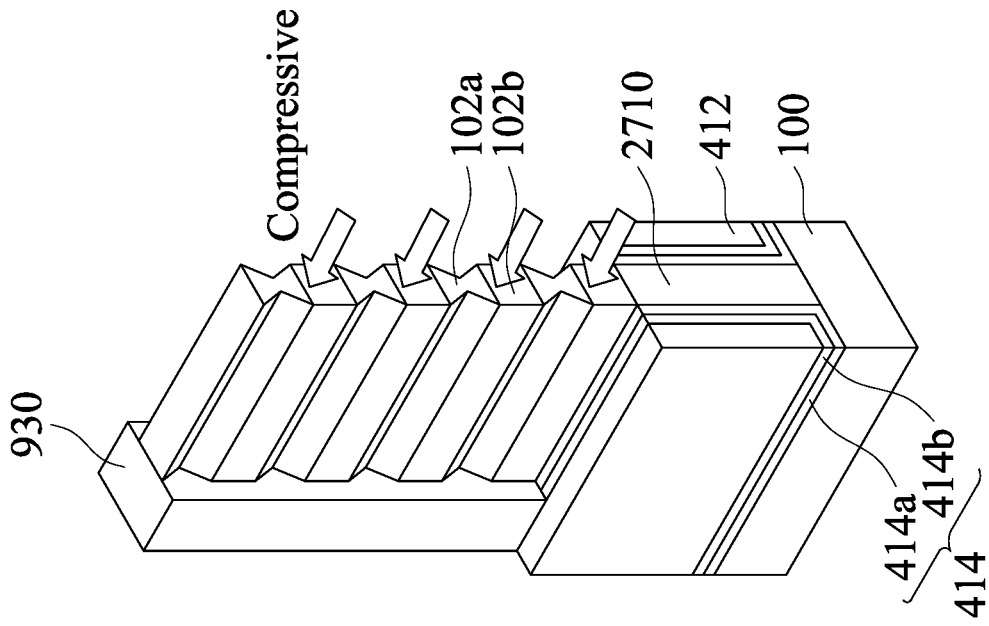
FIGS. 28A-28D illustrate perspective views of various configurations for p-type FinFETs in accordance with some embodiments.
Figure 28B:
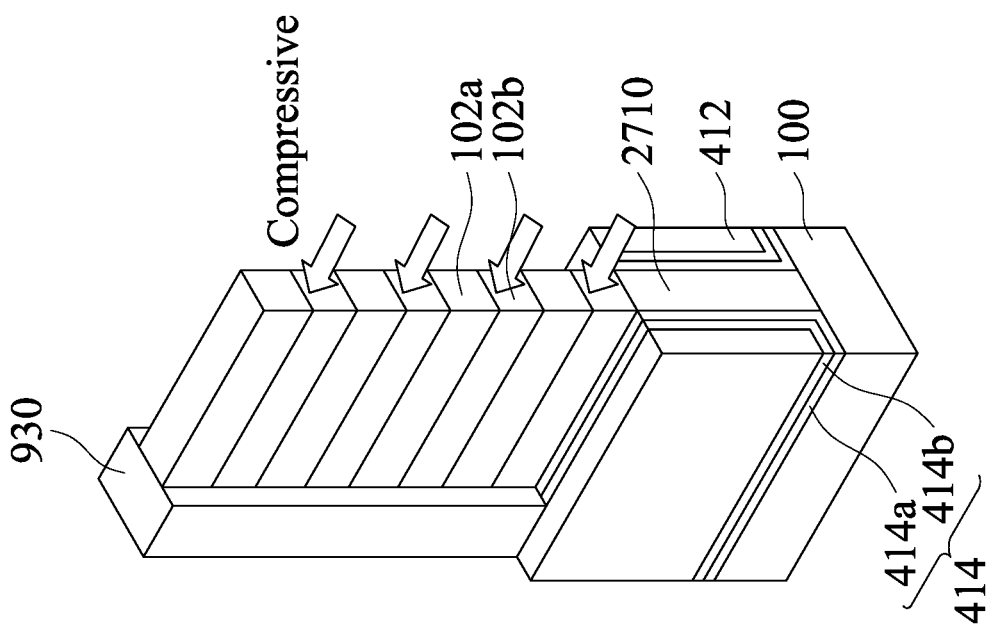
Figure 28D:
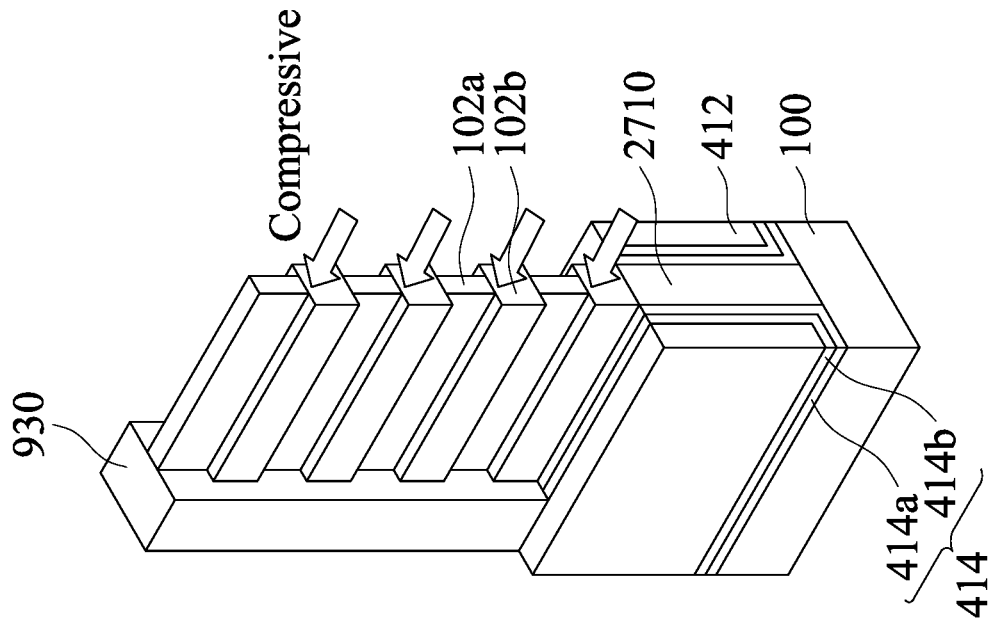
Figure 28C:
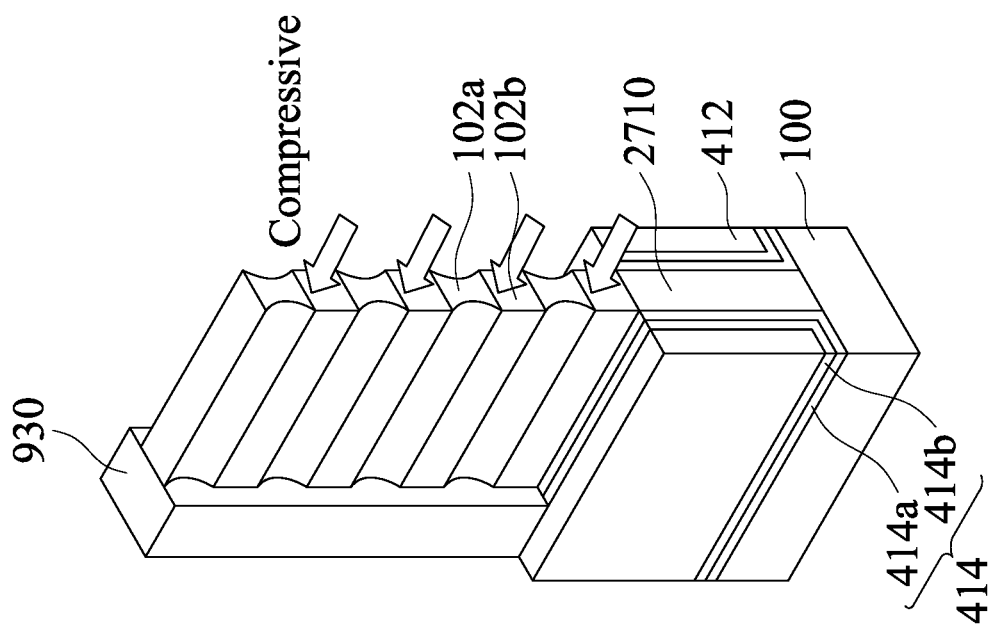
Figure 29:
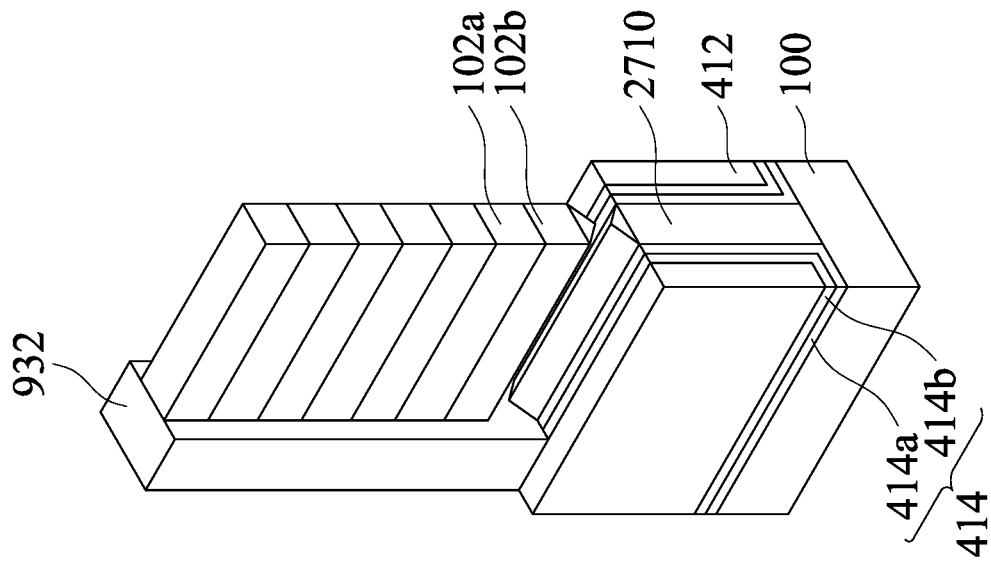
FIGS. 29A-29B illustrate perspective views of various configurations for n-type FinFETs in accordance with some embodiments.
Figure 29:
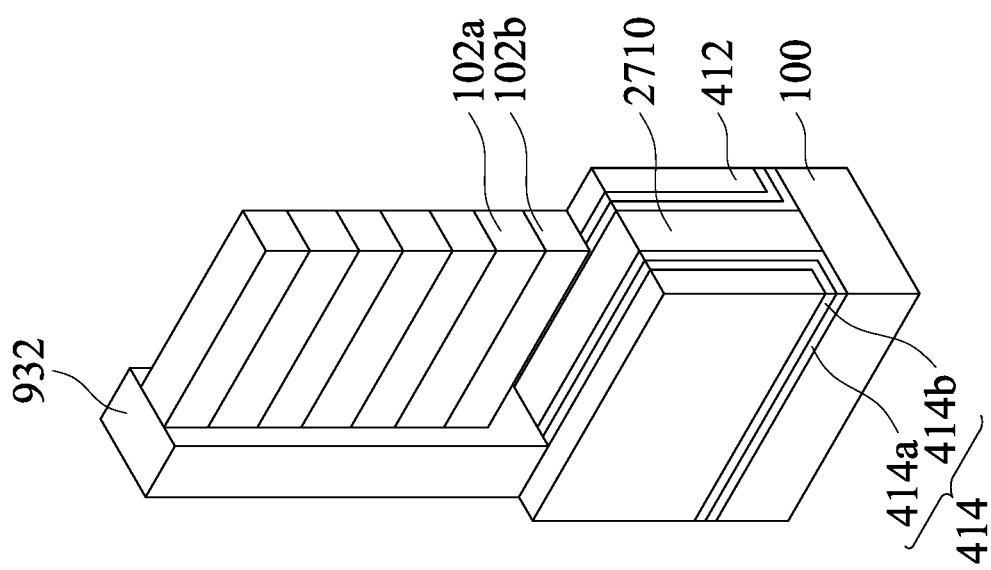

The embodiments illustrated in FIGS. 27A and 28A utilize first epitaxial layers 102a and second epitaxial layers 102b having similar shapes and sizes. In other embodiments, the first epitaxial layers 102a and the second epitaxial layers 102b may have different shapes. For example, FIGS. 27B-27D illustrate various embodiments that utilize partially etched first epitaxial layers 102a, and FIGS. 28B-28D illustrate various embodiments that utilize partially etched second epitaxial layers 102b.

Referring now to FIG. 27B, in embodiments in which the first epitaxial layers 102a are $Si_{0.5}Ge_{0.5}$ and the second epitaxial layers 102b are Si, the first epitaxial layers 102a may be partially etched to form a "V" shaped recess in sidewalls of the first epitaxial layers 102a. In this embodiment, the second epitaxial layers 102b (e.g., the silicon layers) exhibit a (001) crystal orientation along a top surface and a (110) crystal orientation along sidewalls. Etching with a diluted APM or SPM solution at a temperature of about 5° C. to about 50° C. for about 5 seconds to about 100 seconds selectively etches the first epitaxial layers 102a along the (111) crystal orientation, thereby providing a "V" shaped recess having a (111) crystal orientation.

Referring now to FIG. 27C, in embodiments in which the first epitaxial layers 102a are $Si_{0.5}Ge_{0.5}$ and the second epitaxial layers 102b are Si, the first epitaxial layers 102a may be partially etched to form a "U" shaped recess in sidewalls of the first epitaxial layers 102a. In this embodiment, the second epitaxial layers 102b (e.g., the silicon layers) exhibit a (001) crystal orientation along a top surface and a (110) crystal orientation along sidewalls. Performing a dry etch process with HCl or $Cl_2$ gas at a temperature of about 20° C. to about 100° C. and under a pressure of about 5 to about 50 Torr for about 10 seconds to about 100 seconds selectively etches the first epitaxial layers 102a, thereby providing a "U" shaped recess having a (111) crystal orientation.

Referring now to FIG. 27D, in embodiments in which the first epitaxial layers 102a are $Si_{0.5}Ge_{0.5}$ and the second epitaxial layers 102b are Si, the first epitaxial layers 102a may be uniformly etched to form a recess in sidewalls of or thin the first epitaxial layers 102a. In this embodiment, the second epitaxial layers 102b (e.g., the silicon layers) exhibit a (110) crystal orientation along a top surface and a (111) crystal orientation along sidewalls. Etching using APM or SPM solution at a temperature of about 5° C. to about 50° C. for about 5 seconds to about 100 seconds selectively etches the first epitaxial layers 102a, thereby providing a recessed surface having a (111) crystal orientation.

Referring now to FIG. 28B, in embodiments in which the first epitaxial layers 102a are $Si_{0.5}Ge_{0.5}$ and the second epitaxial layers 102b are Si, the second epitaxial layers 102b may be partially etched to form a "V" shaped recess in sidewalls of the second epitaxial layers 102b. In this embodiment, the second epitaxial layers 102b (e.g., the silicon layers) exhibit a (001) crystal orientation along a top surface and the second epitaxial layers 102b exhibit a (110) crystal orientation along sidewalls. Etching with a TMAH or $NH_4OH$ at a temperature of about 5° C. to about 50° C. for about 5 seconds to about 100 seconds selectively etches the second epitaxial layers 102b along the (111) crystal orientation, thereby providing a "V" shaped recess having a (111) crystal orientation.

Referring now to FIG. 28C, in embodiments in which the first epitaxial layers 102a are $Si_{0.5}Ge_{0.5}$ and the second epitaxial layers 102b are Si, the second epitaxial layers 102b may be partially etched to form a "U" shaped recess in sidewalls of the second epitaxial layers 102b. In this embodiment, the second epitaxial layers 102b (e.g., the silicon layers) exhibit a (001) crystal orientation along a top surface and the first epitaxial layers 102a exhibits a (110) crystal orientation along sidewalls. Performing a dry etch process with HCl or $Cl_2$ gas at a temperature of about 20° C. to about 100° C. and under a pressure of about 5 to about 50 Torr for about 5 seconds to about 100 seconds selectively etches the second epitaxial layers 102b, thereby providing a "U" shaped recess.

Referring now to FIG. 28D, in embodiments in which the first epitaxial layers 102a are $Si_{0.5}Ge_{0.5}$ and the second epitaxial layers 102b are Si, the first epitaxial layers 102a may be uniformly etched to form a recess in sidewalls of or thin the first epitaxial layers 102a. In this embodiment, the second epitaxial layers 102b (e.g., the silicon layers) exhibit a (110) crystal orientation along a top surface and the first epitaxial layers 102a exhibit (111) crystal orientation along sidewalls. Etching using TMAH or $NH_4OH$ at a temperature of about 5° C. to about 50° C. for about 5 seconds to about 100 seconds selectively etches the first epitaxial layers 102a, thereby providing a recessed surface having a (111) crystal orientation.

FIGS. 29A and 29B illustrate embodiments in which upper layers of the alternating epitaxial layer structure 102 are separated from the SRB 2710 in the channel region in accordance with some embodiments. In particular, FIG. 29A illustrates an embodiment in which the bottommost first epitaxial layer 102a is completely removed, and FIG. 29B illustrates an embodiment in which a middle portion of the bottommost first epitaxial layer is thinned until the upper layers of the alternating epitaxial layer structure 102 is completely separated from the SRB 2710 in the channel region.

In some embodiments, such as, for example, when the SRB 2710 comprises $Si_{0.3}Ge_{0.7}$, the first epitaxial layer 102a comprises $Si_{0.5}Ge_{0.5}$, and the second epitaxial layer 102b comprises Ge, it may be desirable to remove the one or more layers of the alternating epitaxial layer structure 102, such as the lowermost first epitaxial layer 102a as illustrated in FIG.

29A. Embodiments such as these may be particularly beneficial when forming an n-type FinFET.

In this embodiment, the Ge material has a larger lattice constant than the first epitaxial layer 102a and the SRB 2710, and the SRB 2710 has a larger lattice constant than the first epitaxial layer 102a. In an n-type device, the $Si_{0.5}Ge_{0.5}$ acts as a carrier for electrons in the channel region. Removing the bottommost first epitaxial layer 102a relaxes the adjacent second epitaxial layer 102b (Ge in this illustrated embodiment), and as a result, reduces the compressive stress or induces a tensile stress in the remaining second epitaxial layers 102b.

Figure 30B:
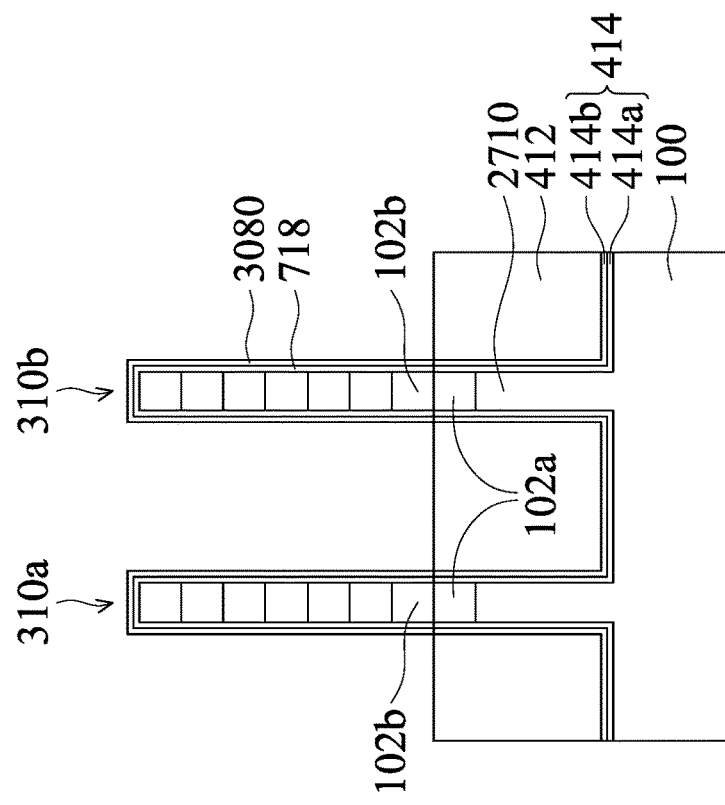
FIGS. 30A-30G illustrate cross-sectional views of intermediate stages in the formation of FinFETs in accordance with some embodiments.
Figure 30A:
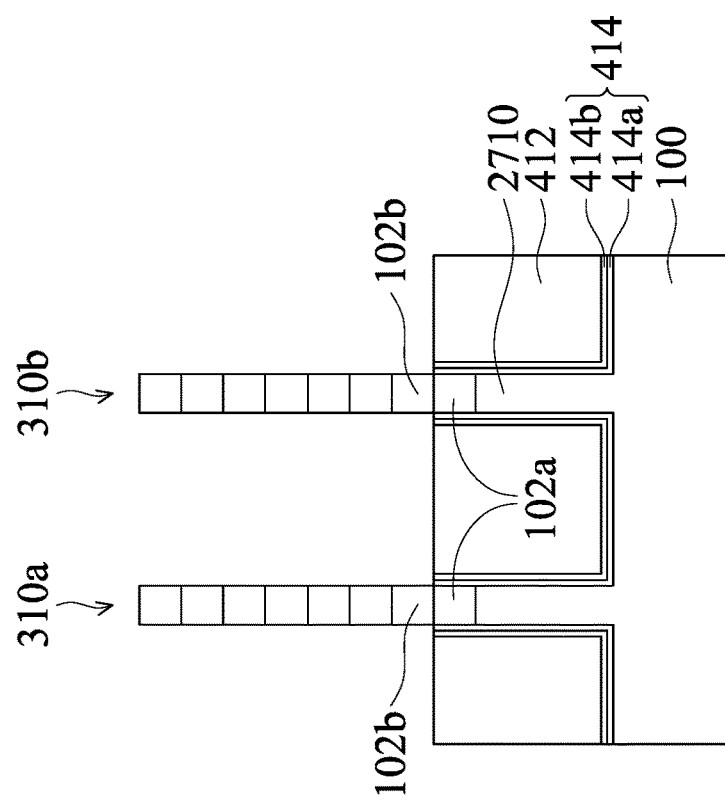

FIGS. 30A-30F illustrate various intermediate process steps for removing the bottommost first epitaxial layer 102a in accordance with some embodiments. FIGS. 30A-30F assume processes similar to those discussed above with reference to FIGS. 1-26, wherein like reference numerals refer to like elements. Referring now to FIG. 30A, it is assumed that processes discussed above with reference to FIGS. 1-4 have been performed. Whereas FIG. 5 illustrates an embodiment in which the STIs 412 are recessed such that the bottommost first epitaxial layer 102a is exposed, the embodiment illustrated in FIG. 30A recesses the STIs 412 such that the bottommost first epitaxial layer 102a is not exposed.

In some embodiments, an additional mask layer 3080 may be formed over the fins prior to forming dummy gate dielectric layer 618 as discussed above with reference to FIG. 6. The additional mask layer 3080 provides additional protection to the fins 310 during subsequent processing to remove the bottommost first epitaxial layer 102a. In these embodiments, the additional mask layer 3080 may be a crystalline silicon cap layer or a silicon nitride layer formed over the fins 310.

Thereafter, processing such as that discussed above with reference to FIGS. 6-21 may be performed. For example, FIG. 30C illustrates the dummy gate electrode 720 formed over the fins 310 and formation of other structures as discussed above with reference to FIGS. 6-21.

Figure 30D:
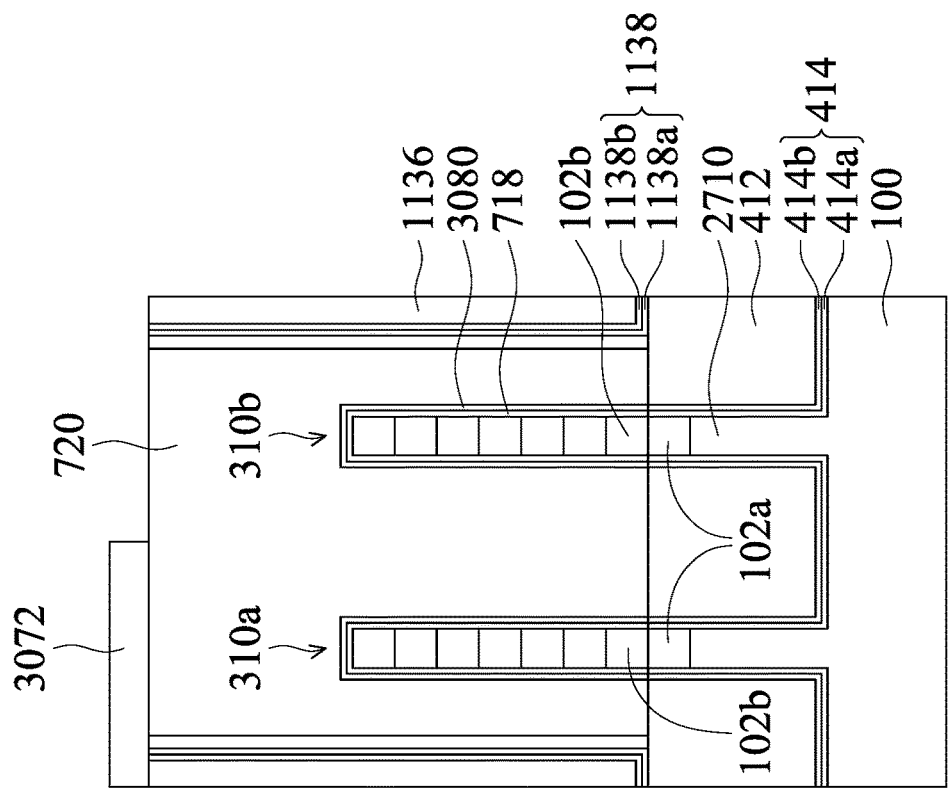
Figure 30C:
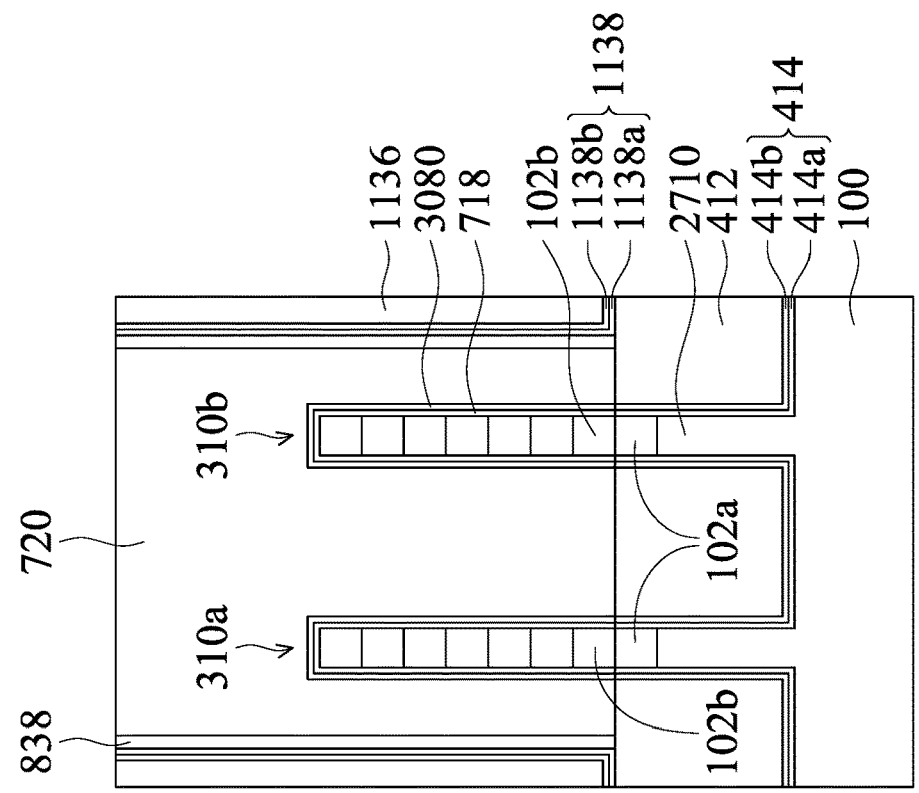
Figure 30:
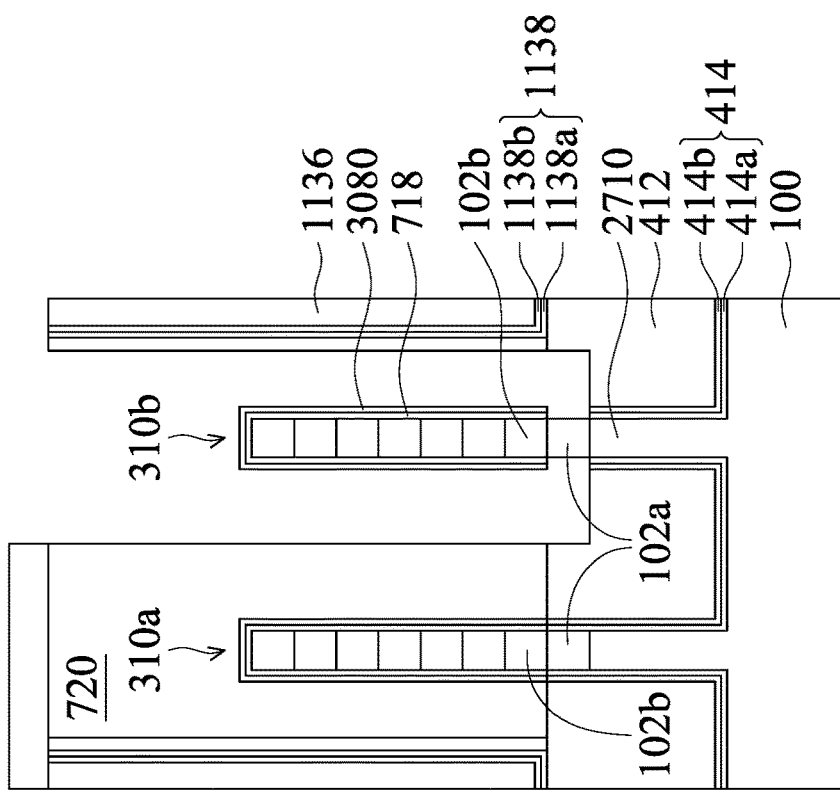
Figure 30:
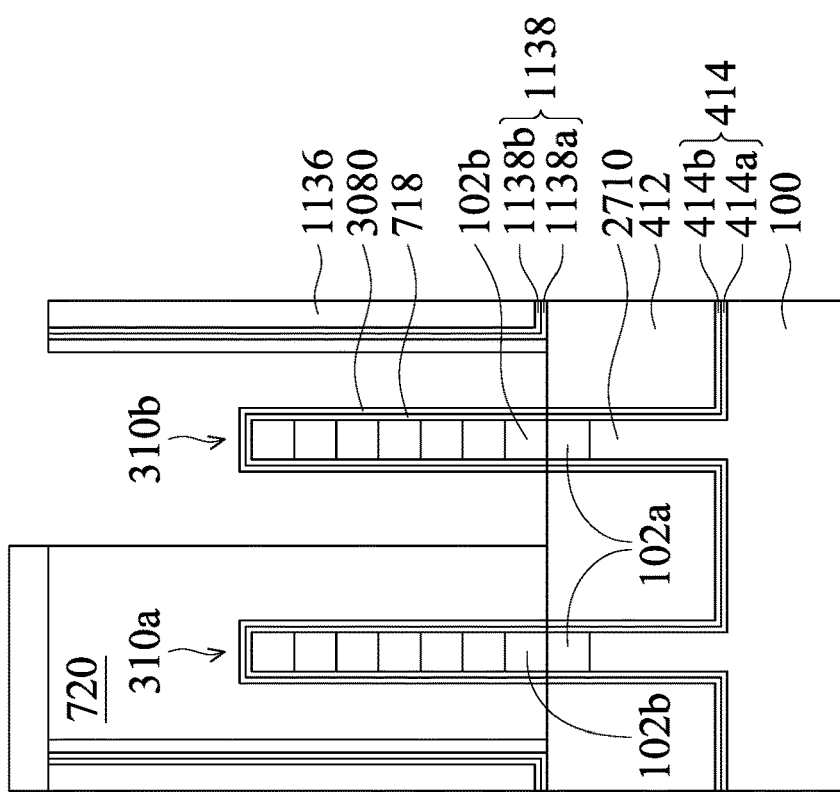
Figure 30G:
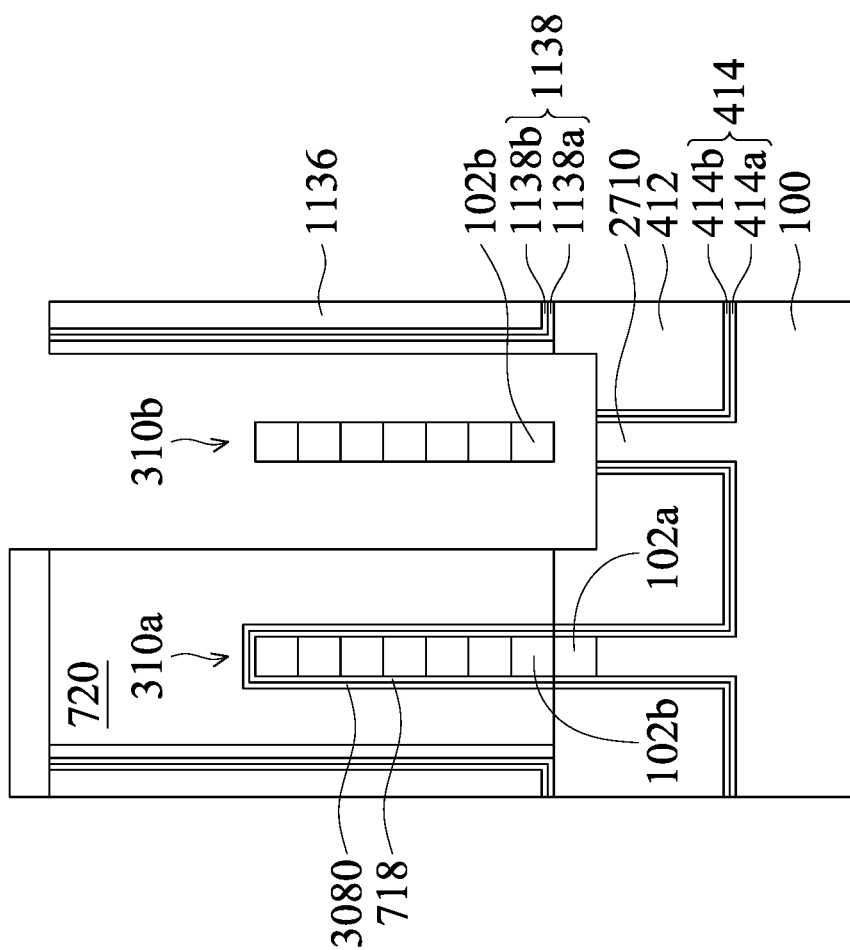

FIG. 30D illustrates masking of the p-type first fin 310a using a patterned mask 3072 in accordance with some embodiments. It is noted that FIGS. 30A-30E illustrate that the p-type first fin 310a is masked for illustrative purposes, but it is understood that the p-type first fin 310a may be processed in accordance with the other processes discussed herein, including those discussed above with reference to FIGS. 1-26. In some embodiments, the patterned mask may be formed of a silicon nitride, though other materials may be used Turning now to FIG. 30E, exposed portions of the dummy gate electrode 720 is removed to expose the second fin 310b and a surface of the STI 412, and FIG. 30F illustrates recessing the STIs 410 to expose the bottommost first epitaxial layer 102a of the second fin 310b. As illustrated in FIG. 30F, the additional mask layer 3080 protects the upper layers of the alternating epitaxial layer structure 102 while the bottommost first epitaxial layer 102a is unprotected by the additional mask layer 3080. As such, the bottommost first epitaxial layer 102a may be etched to separate the upper layers of the alternating epitaxial layer structure 102 from the SRB 2710, thereby relaxing or reducing the compressive stress of the remaining layers of the alternating epitaxial layer structure 102. FIG. 30G illustrates the removal of the bottommost first epitaxial layer 102a in accordance with some embodiments.

The removal of the bottommost first epitaxial layer 102a may be removed using any suitable process. For example, processes such as those discussed above with reference to FIG. 22 may be performed to completely remove the bottommost epitaxial layer 102a as illustrated in FIG. 29A. As another example, processes such as those discussed above with reference to FIG. 27B may be performed for a longer time period to recess opposing sidewalls of the bottommost first epitaxial layer 102a until the upper layers of the alternating epitaxial layer structure 102 are separated from the SRB 2710 as illustrated in FIG. 29B.

Figure 31C:
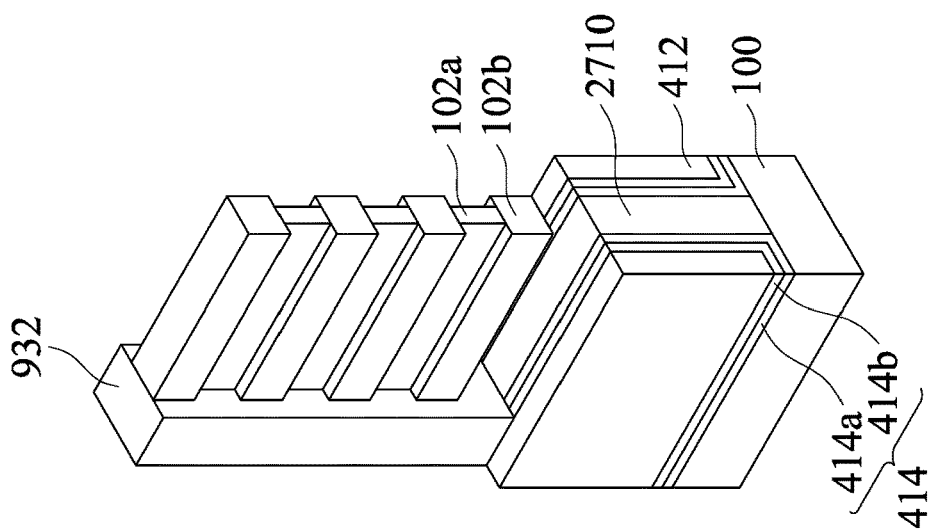
FIGS. 31A-31G illustrate perspective views of various configurations for n-type FinFETs in accordance with some embodiments.
Figure 31B:
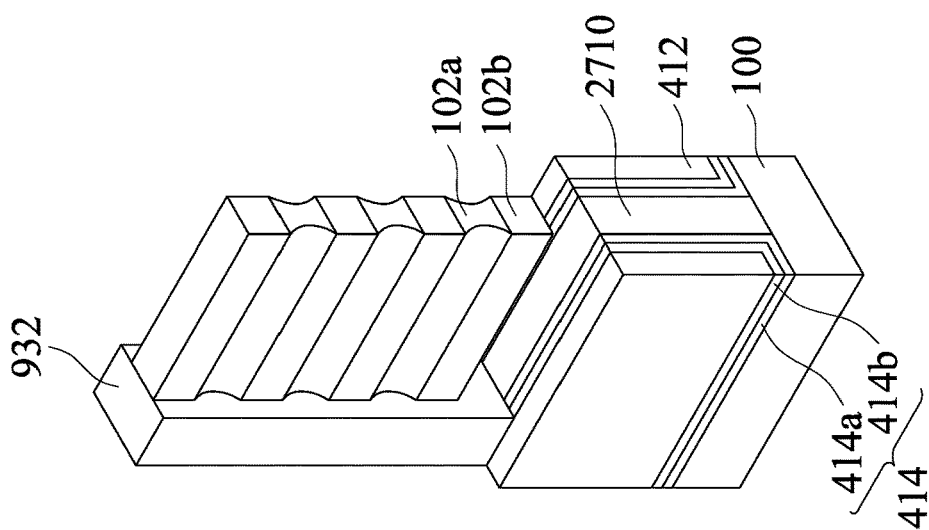
Figure 31A:
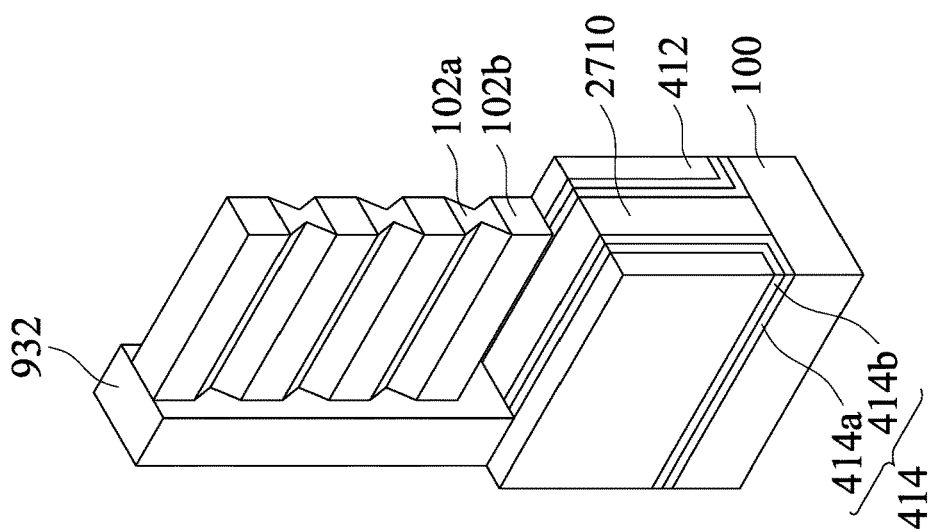
Figure 31F:
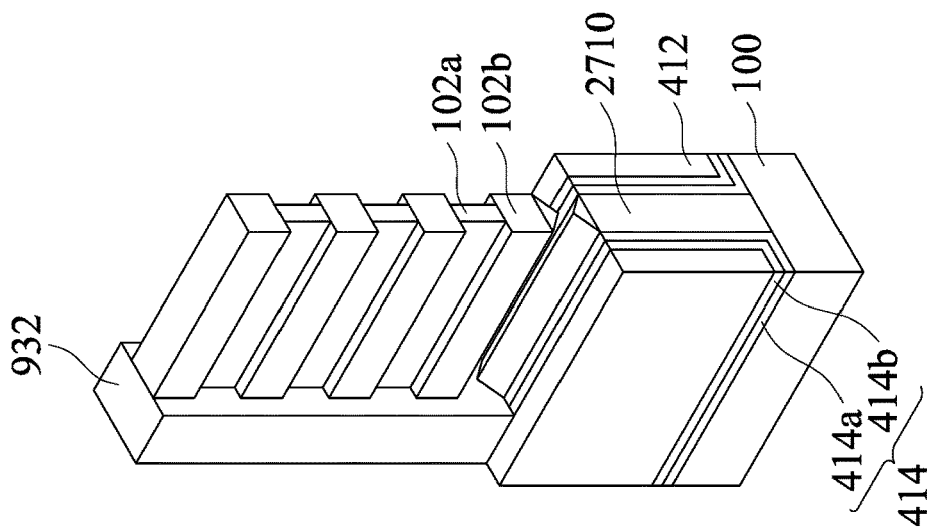

Embodiments illustrated in FIGS. 29A and 29B may be combined with embodiments such as those illustrated in FIGS. 27B-27D and FIGS. 28B-28D. For example FIG. 31A illustrates an embodiment in which the bottommost first epitaxial layer 102a is removed as discussed above with reference to FIG. 29A and the remaining first epitaxial layers 102a are etched to achieve a "V" shaped sidewall as discussed above with reference to FIG. 27B. Similarly, FIG. 31B illustrates an embodiment in which the bottommost first epitaxial layer 102a is removed as discussed above with reference to FIG. 29A and the remaining first epitaxial layers 102a are etched to achieve a "U" shaped sidewall as discussed above with reference to FIG. 27C, and FIG. 31C illustrates an embodiment in which the bottommost first epitaxial layer 102a is removed as discussed above with reference to FIG. 29A and the remaining first epitaxial layers 102a are etched to form recess sidewalls as discussed above with reference to FIG. 27D.

Figure 31E:
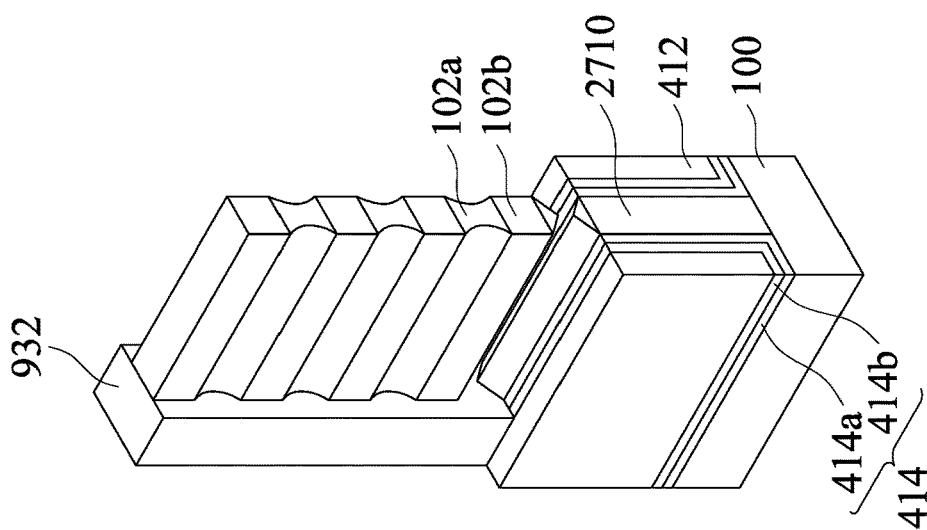
Figure 31D:
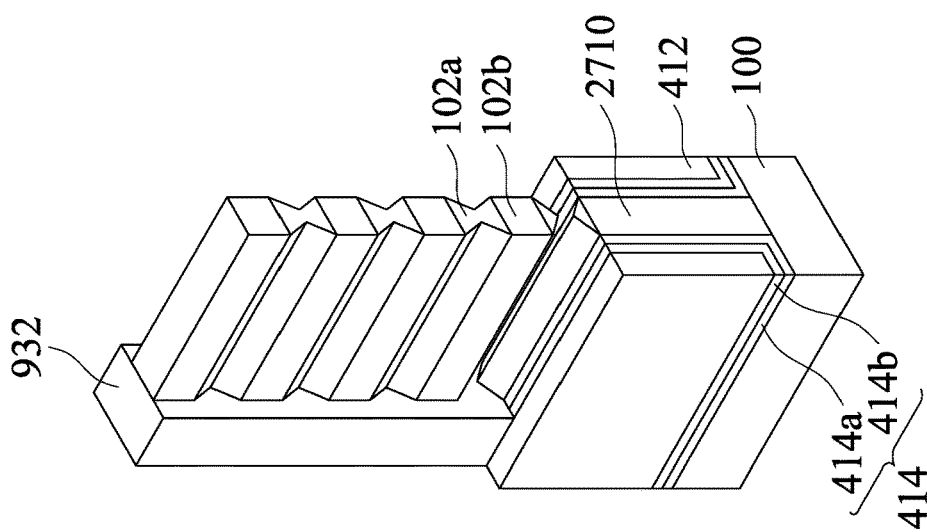

As further examples, FIG. 31D illustrates an embodiment in which the bottommost first epitaxial layer 102a is notched as discussed above with reference to FIG. 29B and the remaining first epitaxial layers 102a are etched to achieve a "V" shaped sidewall as discussed above with reference to FIG. 27B. Similarly, FIG. 31E illustrates an embodiment in which the bottommost first epitaxial layer 102a is notched as discussed above with reference to FIG. 29B and the remaining first epitaxial layers 102a are etched to achieve a "U" shaped sidewall as discussed above with reference to FIG. 27C, and FIG. 31F illustrates an embodiment in which the bottommost first epitaxial layer 102a is notched as discussed above with reference to FIG. 29B and the remaining first epitaxial layers 102a are etched to form recess sidewalls as discussed above with reference to FIG. 27D.

Figure 31G:
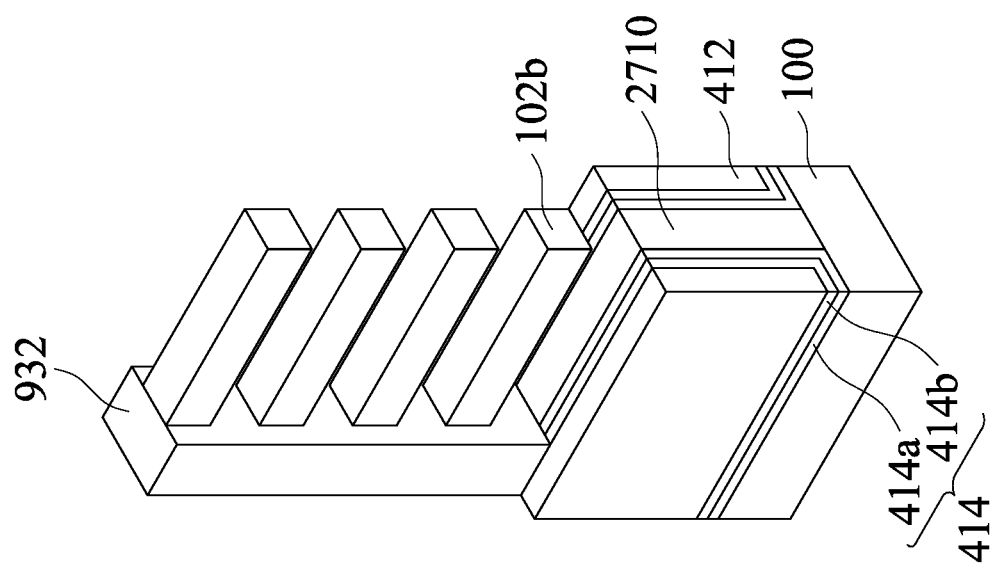

FIG. 31G illustrates an embodiment combining features of FIGS. 1-26 in which all of the first epitaxial layers 102a are removed and a feature of FIG. 27A in which the alternating epitaxial layer structure 102 is formed over the SRB 2710. Relevant processes as those discussed above with reference the above figures may be used.

Figure 32A:
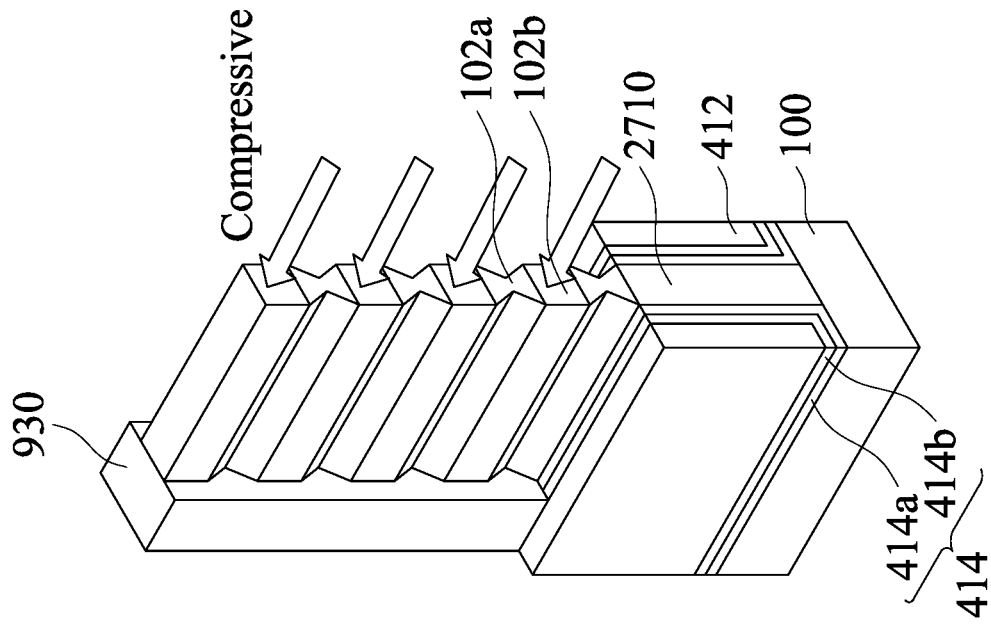
FIGS. 32A-32D illustrate perspective views of various configurations for p-type FinFETs in accordance with some embodiments.
Figure 32B:
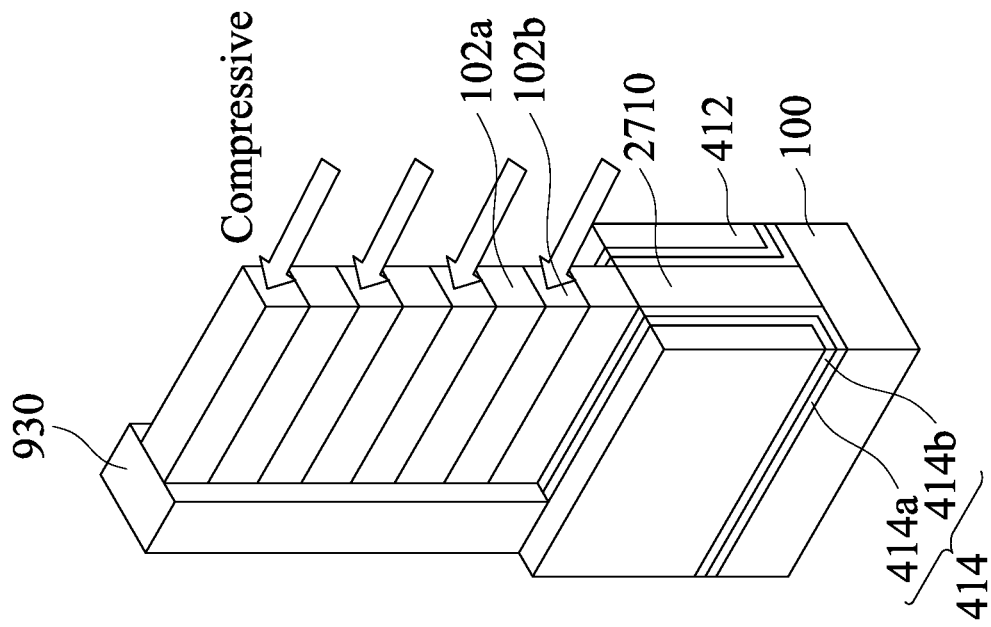

FIGS. 32A-32B illustrate various embodiments that may be used to form p-type devices using the materials discussed above with reference to FIGS. 29A and 29B, in accordance with some embodiments. As noted above, in some embodiments the SRB 2710 comprises $Si_{0.3}Ge_{0.7}$, the first epitaxial layer 102a comprises $Si_{0.5}Ge_{0.5}$, and the second epitaxial layer 102b comprises Ge. In these embodiments, the first source/drain regions for the p-type FinFET may comprise GeSn. Referring first to FIG. 32A, there is shown an embodiment in which all of the first epitaxial layers 102a and the second epitaxial layers 102b remain and sidewalls of neither the first epitaxial layers 102a and the second epitaxial layers 102b are thinned (e.g., "V" shaped, "U" shaped, or notched). In such an embodiment, the Ge material of the second epitaxial layers 102b act as a carrier for holes in a p-type FinFET and will be under a compressive stress due to the smaller lattice constant of the $Si_{0.5}Ge_{0.5}$ of the first epitaxial layer 102a and the $Si_{0.3}Ge_{0.7}$ of the SRB 2710.

Figure 32C:
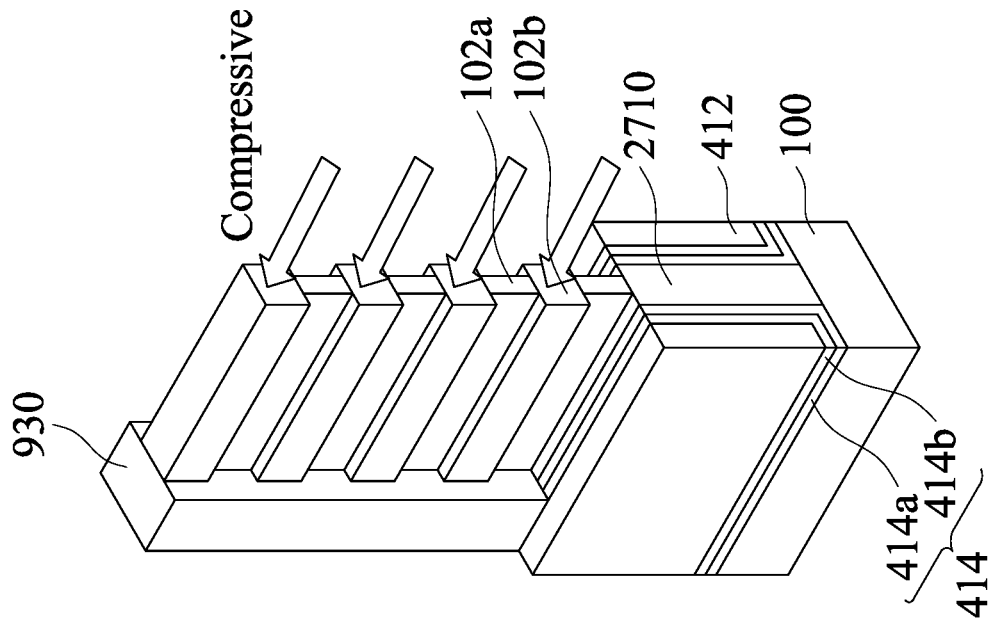
Figure 32D:
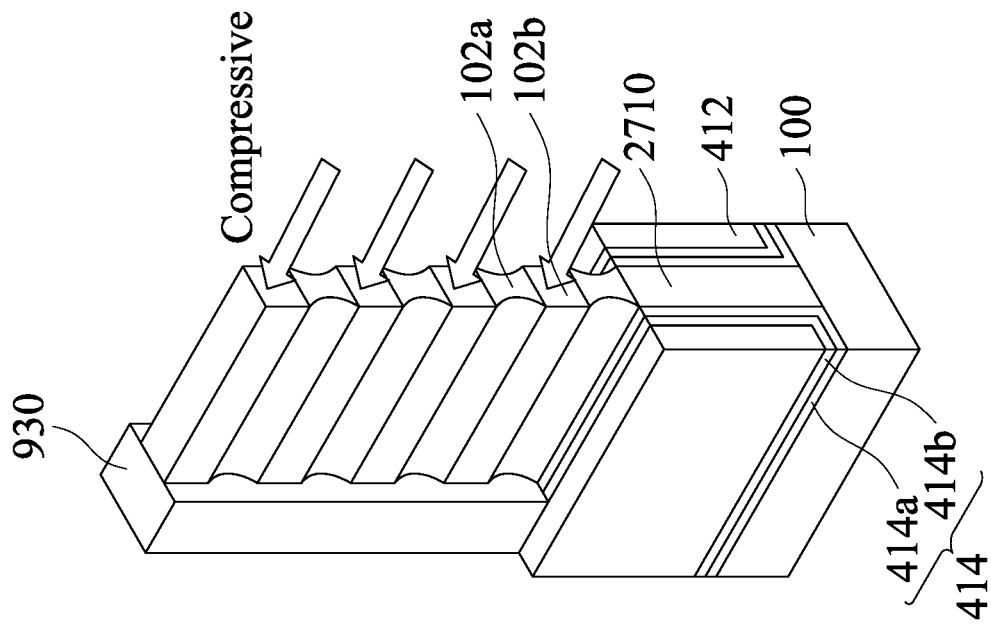

FIGS. 32B-32D illustrate embodiments similar to FIGS. 28B-28D, except sidewalls of the first epitaxial layers 102*a* are thinned in FIG. 32B-32D, rather than sidewalls of the second epitaxial layers 102*b* of FIGS. 28B-28D. For example, FIGS. 28B-28D illustrate embodiments in which the first epitaxial layers 102*a* comprise $Si_{0.5}Ge_{0.5}$ and the second epitaxial layers 102*b* comprise Si. In a p-type device, the $Si_{0.5}Ge_{0.5}$ acts as the hole carrier and would be under a compressive stress due to the smaller lattice constant of the Si material of the second epitaxial layer 102*b*. In FIGS. 30B-30D, the Ge material of the second epitaxial layers 102*b* act as the hole carriers and are under a compressive stress due to the smaller lattice constant of the $Si_{0.5}Ge_{0.5}$ of the first epitaxial layers 102*a* and the $Si_{0.3}Ge_{0.7}$ of the SRB 2710. Accordingly, the first epitaxial layers 102*a* are thinned, thereby improving the gate control of the second epitaxial layers 102*b*. Similar processes may be used to form the "V" shaped sidewall in the $Si_{0.5}Ge_{0.5}$ of the first epitaxial layers 102*a* in FIG. 32B as discussed above with reference to the $Si_{0.5}Ge_{0.5}$ of the first epitaxial layers 102A in FIG. 28B. Similar processes may be used to form the "U" shaped sidewall in the $Si_{0.5}Ge_{0.5}$ of the first epitaxial layers 102*a* in FIG. 32C as discussed above with reference to the $Si_{0.5}Ge_{0.5}$ of the first epitaxial layers 102A in FIG. 28C. Similar processes may be used to form the indented or notched sidewall in the $Si_{0.5}Ge_{0.5}$ of the first epitaxial layers 102*a* in FIG. 32D as discussed above with reference to the $Si_{0.5}Ge_{0.5}$ of the first epitaxial layers 102A in FIG. 28D.

As will be appreciated, embodiments such as those discussed herein provide greater gate control by providing, for example nanowire structures and greater gate interaction with the current carrying layers. For example, the creation of the nanowire structures in the channel region allows a GAA structure and greater gate control. Similarly, using alternating layers of epitaxial materials allows for a greater stress (compressive or tensile) and thinning select layers allows for greater gate control as well. As such, similar materials may be used for both n-type and p-type devices that utilize different processing in the channel regions, thereby reducing manufacturing costs and processing time related to the growth of different epitaxial layers.

Furthermore, the use of the alternating epitaxial layer structure 102 provides an improvement in device performance. The alternating epitaxial layer structure 102 prevents or reduces strain relaxation by inserting alternating stress layers. By selecting materials such that the stress (compressive or tensile) is exerted on the layer that acts as the carrier (e.g., for holes or electrons), the stress in the current carrying layer may be controlled to a greater degree.

In an embodiment, a method of forming a semiconductor device is provided. The method includes forming a first fin and a second fin, each of the first fin and the second fin comprising an alternating epitaxial structure, the alternating epitaxial structure having a plurality of epitaxial layers, the plurality of epitaxial layers comprising first epitaxial layers and second epitaxial layers, the first epitaxial layers comprising a first semiconductor material, the second epitaxial layers comprising a second semiconductor material, layers of the alternating epitaxial structure alternating between one of the first epitaxial layers and one of the second epitaxial layers. A first dielectric layer is formed over the first fin and the second fin, and a channel region of the second fin is exposed. The method further includes removing at least a portion of the first epitaxial layers in the channel region of the second fin, forming a first gate stack over the first fin, the first gate stack extending along sidewalls of the first epitaxial layers and the second epitaxial layers of the first fin, and forming a second gate stack over the second fin, the second gate stack extending along sidewalls of the second epitaxial layers.

In another embodiment, a method of forming a semiconductor device is provided. The method includes forming a first fin and a second fin, each of the first fin and the second fin comprising an alternating epitaxial structure, the alternating epitaxial having a plurality of epitaxial layers, the plurality of epitaxial layers comprising first epitaxial layers and second epitaxial layers, the first epitaxial layers comprising a first semiconductor material, the second epitaxial layers comprising a second semiconductor material, layers of the alternating epitaxial structure alternating between one of the first epitaxial layers and one of the second epitaxial layers. Sidewalls of at least one of the first epitaxial layers in a first channel region of the first fins are electively etched, and sidewalls of at least one of the second epitaxial layers in a second channel region of the second fin are selectively etched. A first gate stack is formed over the first fin, and a second gate stack is formed over the second fin.

In yet another embodiment, a semiconductor device is formed. The device includes a substrate, first source/drain regions and a first channel region interposed between the first source/drain regions, the first source/drain regions and the channel region comprising alternating layers of first epitaxial layers and second epitaxial layers, and second source/drain regions and a second channel region interposed between the second source/drain regions, the second source/drain regions comprising alternating layers of the first epitaxial layers and the second epitaxial layers, the second channel region comprising the second epitaxial layer wherein a gap in the first epitaxial layer exists between the second source/drain regions. A first gate electrode extends over the first channel region, and a second gate electrode extends over the second channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate;
    first source/drain regions and a first channel region between the first source/drain regions, the first channel region comprising alternating layers of first epitaxial layers and second epitaxial layers, the first epitaxial layers and the second epitaxial layers extending continuously between the first source/drain regions;
    second source/drain regions and a second channel region between the second source/drain regions, the second channel region comprising the second epitaxial layers;
    a first gate electrode extending over the first channel region; and
    a second gate electrode extending over the second channel region, wherein the second gate electrode extends between adjacent ones of the second epitaxial layers.

2. The semiconductor device of claim 1, wherein the first source/drain regions are part of an p-type transistor.

3. The semiconductor device of claim 2, wherein the second source/drain regions are part of a n-type transistor.

4. The semiconductor device of claim 3, wherein the second epitaxial layers are silicon.

5. The semiconductor device of claim 4, wherein the first epitaxial layers are silicon germanium.

6. The semiconductor device of claim 1, wherein sidewalls of the first epitaxial layers in the first region are recessed from sidewalls of adjacent ones of the second epitaxial layers in the first region.

7. The semiconductor device of claim 1, wherein a width of the first epitaxial layers in the first region is less than a width of the second epitaxial layers in the first region.

8. A semiconductor device, comprising:
a first active structure on a first region of a substrate, the first active structure including first silicon elements vertically stacked, the first silicon elements being spaced apart from each other;
a first gate structure on the substrate and the first active structure, the first gate structure extending between the silicon elements in the first region of the substrate;
a second active structure on a second region of the substrate, the second active structure including alternating silicon germanium elements and second silicon elements vertically stacked; and
a second gate structure on the second active structure and the substrate.

9. The semiconductor device of claim 8, wherein:
the first gate structure includes a first gate insulation layer and a first gate electrode,
the second gate structure includes a second gate insulation layer and a second gate electrode, and
a thickness of the second gate insulation layer is greater than a thickness of the first gate insulation layer.

10. The semiconductor device of claim 8, wherein the first gate structure completely fills the space between adjacent ones of the silicon elements in the first active structure.

11. The semiconductor device of claim 8, wherein the second active structure and the second gate structure are parts of a p-type transistor.

12. The semiconductor device of claim 8, wherein the first active structure and the first gate structure are parts of an n-type transistor.

13. The semiconductor device of claim 8, wherein sidewalls of the second silicon elements in the second region are concave.

14. The semiconductor device of claim 8, wherein a bottommost layer of the second active structure in the second region is lower than a bottommost layer of the first active structure in the first region.

15. A semiconductor device comprising:
a substrate;
a first source region, a first drain region, and a first channel region between the first source region and the first drain region over the substrate, the first channel region comprising alternating layers of first silicon germanium layers and first silicon layers, the first silicon germanium layers and the first silicon layers extending continuously between the first source region and the first drain region;
a second source region, a second drain region, and a second channel region between the second source region and the second drain region over the substrate, the second channel region comprising second silicon layers, wherein the second channel region is free of silicon germanium layers, wherein a bottommost layer of the first channel region is lower than a bottommost layer of the second channel region;
a first gate structure extending over the first channel region, the first gate structure extending along sidewalls of the first silicon germanium layers and the first silicon layers; and
a second gate structure extending over the second channel region, the second gate structure extending between adjacent ones of the second silicon layers.

16. The semiconductor device of claim 15, wherein the first gate structure and the second gate structure comprise a single continuous conductive element extending over the first channel region and the second channel region.

17. The semiconductor device of claim 15, wherein:
the first gate structure includes a first gate insulation layer and a first gate electrode,
the second gate structure includes a second gate insulation layer and a second gate electrode, and
a thickness of the second gate insulation layer between adjacent ones of the second silicon layers is greater than a thickness of the first gate insulation layer.

18. The semiconductor device of claim 15, wherein the substrate comprises a strain relaxation buffer between a semiconductor substrate and the first channel region.

19. The semiconductor device of claim 15, wherein the second gate structure extends completely between a bottommost layer of the second silicon layers of the second channel region and the substrate.

20. The semiconductor device of claim 15, wherein the first source region and the first drain region are p-type regions, wherein the second source region and the second drain region are n-type regions.

* * * * *